United States Patent
Lillelund

(10) Patent No.: US 8,625,832 B2
(45) Date of Patent: Jan. 7, 2014

(54) PACKAGES AND METHODS FOR PACKAGING MICROPHONE DEVICES

(75) Inventor: Christian Lillelund, Fredensborg (DK)

(73) Assignee: Invensense, Inc., San Jose, CA (US)

( * ) Notice: Subject to any disclaimer, the term of this patent is extended or adjusted under 35 U.S.C. 154(b) by 14 days.

(21) Appl. No.: 13/282,990

(22) Filed: Oct. 27, 2011

(65) Prior Publication Data

US 2012/0250925 A1 Oct. 4, 2012

Related U.S. Application Data

(60) Provisional application No. 61/471,604, filed on Apr. 4, 2011.

(51) Int. Cl.
*H04R 9/08* (2006.01)
*H04R 25/00* (2006.01)

(52) U.S. Cl.
USPC .............................. 381/355; 381/174; 381/175

(58) Field of Classification Search
USPC ........................... 381/355, 369, 170, 174, 175
See application file for complete search history.

(56) References Cited

U.S. PATENT DOCUMENTS

| | | | |
|---|---|---|---|
| 4,575,330 A | 3/1986 | Hull | |
| 4,752,352 A | 6/1988 | Feygin | |
| 4,863,538 A | 9/1989 | Deckard | |
| 5,313,365 A * | 5/1994 | Pennisi et al. | 361/760 |
| 5,348,693 A | 9/1994 | Taylor et al. | |
| 5,870,482 A | 2/1999 | Loeppert et al. | |
| 6,781,231 B2 | 8/2004 | Minervini | |
| 7,202,552 B2 | 4/2007 | Zhe et al. | |
| 7,242,089 B2 | 7/2007 | Minervini | |
| 7,255,551 B2 | 8/2007 | Taylor et al. | |
| D575,056 S * | 8/2008 | Tan | D3/218 |
| 8,199,939 B2 | 6/2012 | Suvanto et al. | |
| 8,300,870 B2 * | 10/2012 | Lee et al. | 381/352 |
| 2007/0053504 A1 * | 3/2007 | Sato et al. | 379/156 |
| 2007/0071268 A1 | 3/2007 | Harney et al. | |

(Continued)

FOREIGN PATENT DOCUMENTS

| WO | WO 2007/129787 | 11/2007 |
|---|---|---|
| WO | WO 2011/103720 | 9/2011 |

OTHER PUBLICATIONS

Chait et al. "Custom Designed Microstructures Using Metamaterials," Antenna Systems & Technology Magazine and Conference, World Wide Web Address: antennasonline.com/eprints/EoPlex_Sept10.html; accessed Aug. 24, 2012.

(Continued)

*Primary Examiner* — Ahmad Matar
*Assistant Examiner* — Norman Yu
(74) *Attorney, Agent, or Firm* — Maryam Imam; IPxLAW Group LLP

(57) ABSTRACT

Packages for electronic amplification include a packaged microphone device that includes a housing and an acoustic transducer disposed therein. The housing includes an exterior top surface and an exterior bottom surface that includes electrical terminals disposed thereon. The package microphone device can include a flexible substrate having a top portion, a bottom portion and a flexible middle portion. The flexible middle portion is folded around the housing such that the top portion at least partially overlays and attaches to the exterior top surface of the housing and the bottom portion at least partially overlays and attaches to the exterior bottom surface of the housing.

41 Claims, 11 Drawing Sheets

(56) References Cited

U.S. PATENT DOCUMENTS

| | | |
|---|---|---|
| 2007/0202627 A1 | 8/2007 | Minervini |
| 2007/0278601 A1 | 12/2007 | Goodelle et al. |
| 2008/0075309 A1* | 3/2008 | Chen et al. .................. 381/175 |
| 2008/0175425 A1 | 7/2008 | Roberts et al. |
| 2008/0217766 A1 | 9/2008 | Minervini |
| 2008/0304681 A1 | 12/2008 | Langlois et al. |
| 2009/0200620 A1* | 8/2009 | Omura et al. ................ 257/419 |
| 2009/0202089 A1 | 8/2009 | Zhang et al. |
| 2009/0320698 A1 | 12/2009 | LaPerna Wong |
| 2010/0009133 A1 | 1/2010 | Chait |
| 2010/0086146 A1 | 4/2010 | Gong et al. |
| 2010/0090295 A1 | 4/2010 | Zhe et al. |
| 2010/0142744 A1 | 6/2010 | Rombach et al. |
| 2010/0155863 A1* | 6/2010 | Weekamp .................... 257/416 |
| 2011/0198714 A1 | 8/2011 | Yang |
| 2012/0237073 A1 | 9/2012 | Goida et al. |

OTHER PUBLICATIONS

Chait, "High-Volume Print Forming, HVPF™ A New Method for Manufacturing Large Volumes of Complex Metal-Ceramic and Hybrid Components," World Wide Web Address: eoplex.com/images/eoplex_whitepaper_hvpf.pdf, accessed Aug. 24, 2012.

* cited by examiner

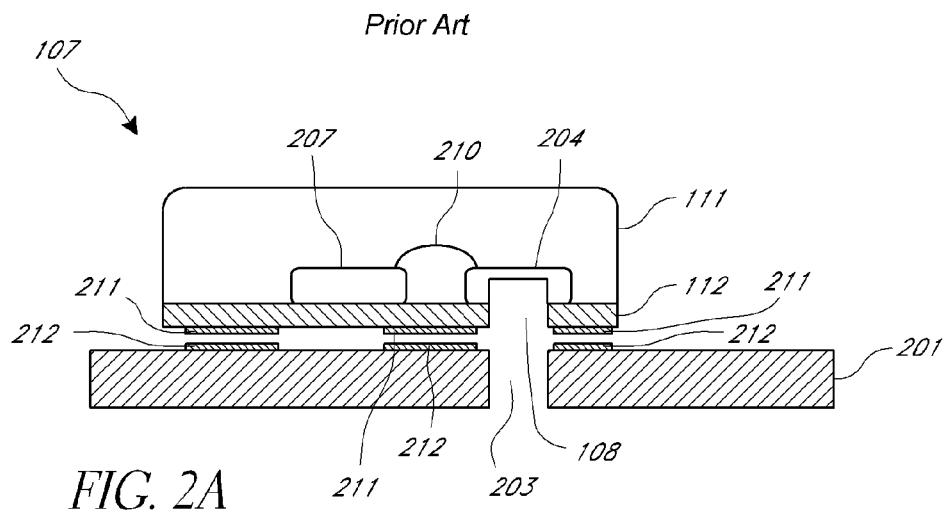
FIG. 2A *Prior Art*
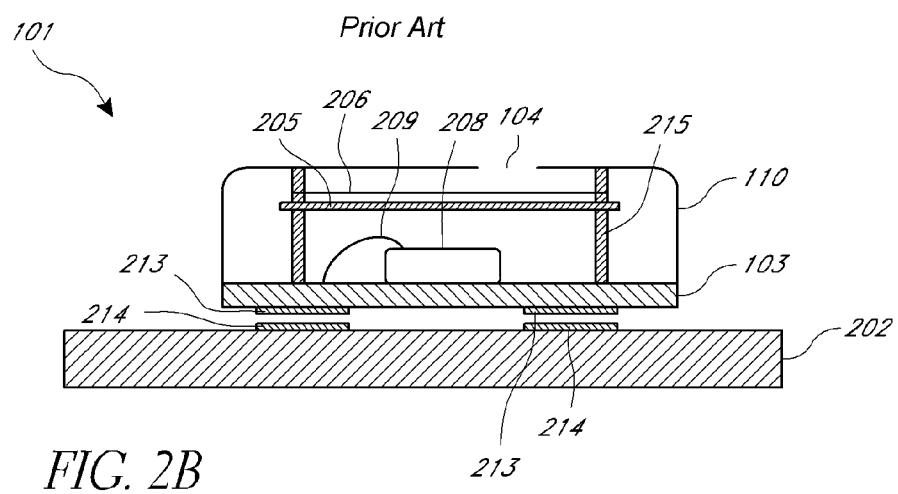
FIG. 2B *Prior Art*

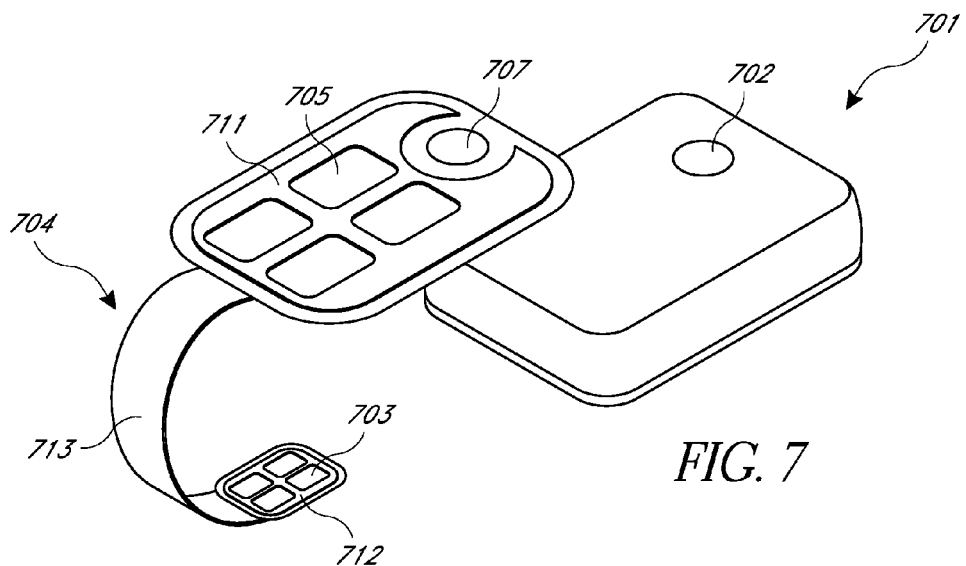
FIG. 7
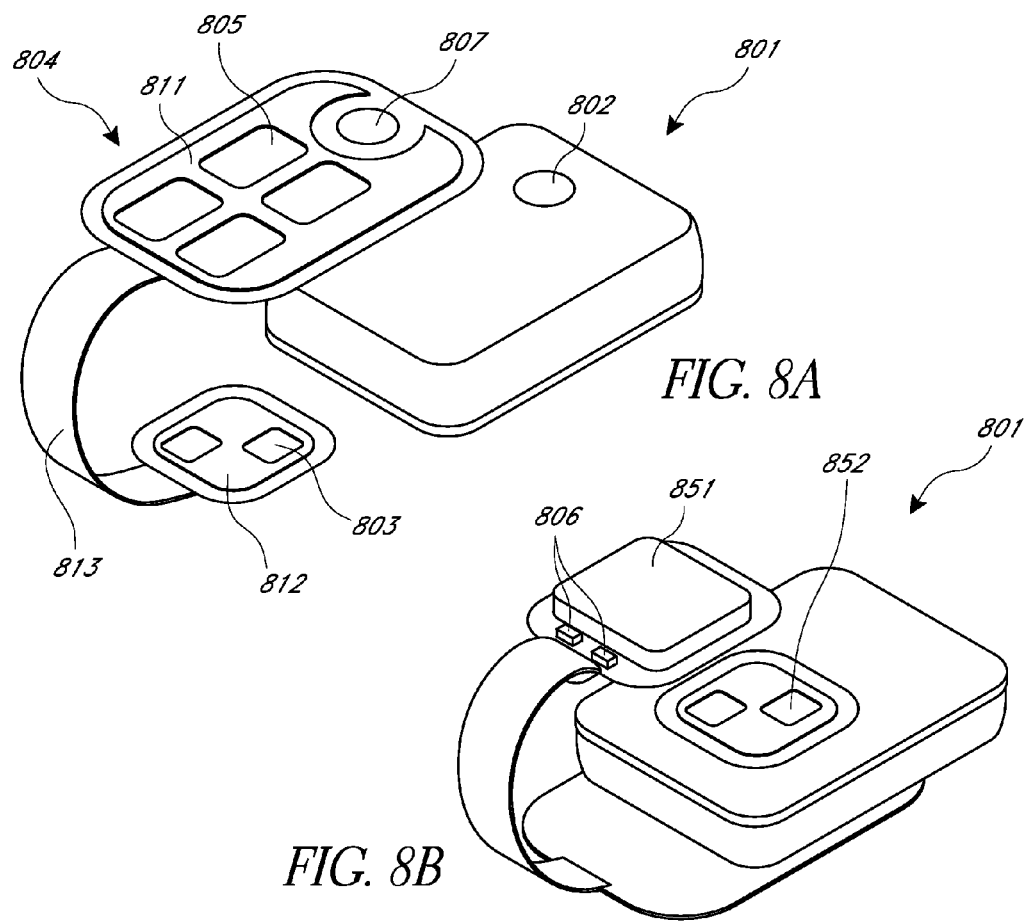
FIG. 8A
FIG. 8B

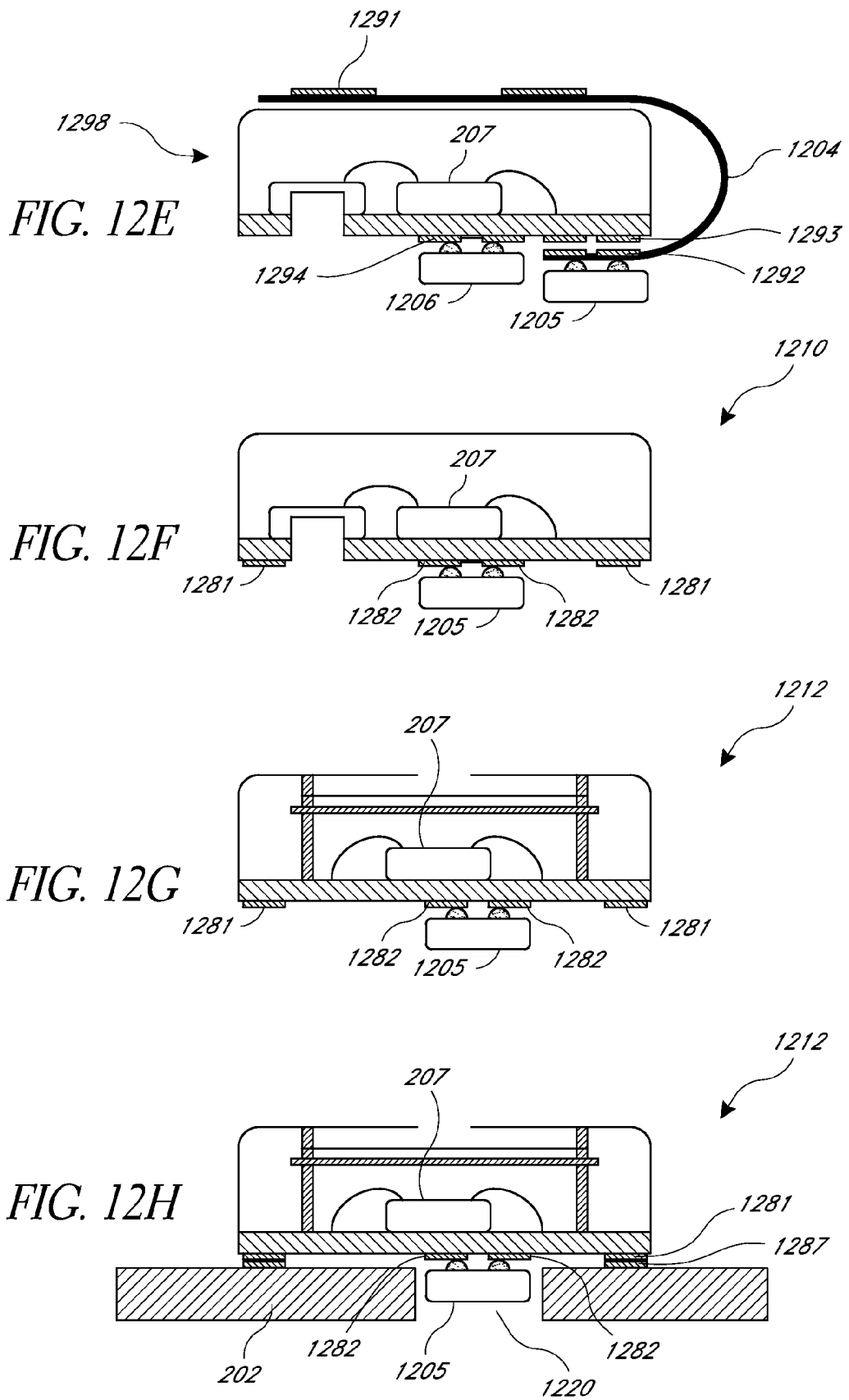

PACKAGES AND METHODS FOR PACKAGING MICROPHONE DEVICES

CROSS-REFERENCE TO RELATED APPLICATIONS

The present application claims priority to U.S. Provisional Patent Application No. 61/471,604, filed Apr. 4, 2011, titled "PACKAGES AND METHODS FOR PACKAGING MICROPHONE DEVICES," the entirety of which is hereby incorporated herein by reference.

BACKGROUND

1. Field

Embodiments of the invention relate to microphone devices and methods for packaging the same.

2. Description of the Related Technology

Generally, relatively small-sized acoustic transducer components are configured for surface mounting on a carrier board, such as a printed circuit board, to establish electrical contact between the acoustic transducer component and electronic circuitry disposed on the carrier board. The acoustic transducer component is provided with a sound port, typically in the form of a hole, for allowing passage of sound pressure between the exterior of the component and an acoustic transducer disposed inside the acoustic transducer component.

Conventionally, the sound port is provided either as a top-port or a bottom-port. In a top-port configuration, the transducer component or package has electrodes or solder-pads disposed on a bottom surface abutting the carrier board and the sound port is disposed on a top surface. Conversely, in a bottom-port configuration, the sound port is disposed on the bottom surface with the electrodes or solder-pads positioned around the sound port opening. Thus, a bottom-port package has the sound port on the same side as the package leads, whereas a top-port package has the sound port on a different, typically opposite, side from the package leads. The acoustic transducer component of a bottom-port design is typically mounted on a carrier board with a hole aligned with the sound port opening to allow passage of sound pressure between the exterior of the component and the acoustic transducer inside the acoustic transducer component.

Typically, microelectromechanical systems (MEMS) microphone devices are configured with a bottom-port to aid in providing a sufficiently large back volume behind a moveable member of the acoustic transducer. Condenser microphones or electret condenser microphones (ECMs) have a different construction and are typically configured with a top-port to allow a sufficiently large back volume.

The construction of the product using the acoustic transducer (e.g., a mobile phone) can dictate use of either the MEMS devices or the ECM devices, depending upon whether the mounting area is better suited to bottom-port or top-port mounting. However, since the two types of microphone devices have different properties and qualities, in certain implementations, such as those demanding a relatively high signal-to-noise ratio, it may not be desirable for the structure of the product incorporating the microphone package to dictate the type of the acoustic transducer.

Conventionally, an acoustic transducer component or package comprises an acoustic transducer and a housing that includes lid and a rigid substrate with first and second surfaces opposite each other. The housing has an exterior top surface, and the rigid substrate is disposed with its second surface as an exterior bottom surface of the housing. Electrical terminals are disposed on the second surface of the rigid substrate. The acoustic transducer component is also denoted a microphone package.

Examples of acoustic transducer components or packages are disclosed, e.g., in US Patent Publication No. 2010/0090295 and U.S. Pat. No. 7,202,552. There is a need for improved microphone packages, and methods of forming the same.

SUMMARY

In one embodiment, a component assembly includes an acoustic transducer component and a flexible substrate. The acoustic transducer component includes a housing and an acoustic transducer disposed therein. The housing includes a rigid substrate with first and second surfaces opposite each other, and the housing has an exterior top surface. The rigid substrate is disposed with its second surface as an exterior bottom surface of the housing, and electrical terminals are disposed on the second surface of the rigid substrate. The flexible substrate has a first portion and a second portion and is flexible at least between the first and second portion. Each portion includes opposing sides. The flexible substrate is folded around the acoustic transducer component with its first portion overlaying and attached to the exterior top surface and its second portion at least partially overlaying and attached to the exterior bottom surface. The flexible substrate is provided with electrically conductive traces exposed on the side of the first portion that faces away from the housing and connecting to at least one of the electrical terminals.

In another embodiment, a method of manufacturing a component assembly is provided. The method includes providing an acoustic transducer component with a housing having an exterior top surface and an exterior bottom surface. Electrical terminals are disposed on the exterior bottom surface. The method further includes attaching to the acoustic transducer component a flexible substrate having a first portion and a second portion each with opposing sides. The flexible substrate is folded around the acoustic transducer component with its first portion overlaying the exterior top surface and its second portion at least partially overlaying the exterior bottom surface. The flexible substrate is provided with electrically conductive paths exposed on the side of the first portion that faces away from the housing and connecting to at least one of the electrical terminals.

In another embodiment, a component assembly includes a packaged microphone device and a flexible substrate. The packaged microphone device includes a housing and an acoustic transducer disposed therein. The housing has an exterior top surface and an exterior bottom surface opposite the exterior top surface. The exterior bottom surface of the housing includes electrical terminals disposed thereon. The flexible substrate has a top portion, a bottom portion and a flexible middle portion. The flexible middle portion is disposed between the top and bottom portions. The flexible middle portion is folded around the housing such that the top portion at least partially overlays and attaches to the exterior top surface of the housing and the bottom portion at least partially overlays and attaches to the exterior bottom surface of the housing. The flexible substrate includes a trace electrically connected to at least one of the electrical terminals.

In another embodiment, a component assembly includes a packaged microphone device and an electronic component. The packaged microphone device includes a housing and an acoustic transducer disposed therein. The housing has an exterior top surface and an exterior bottom surface opposite the exterior top surface. The exterior bottom surface of the housing includes electrical terminals disposed thereon. The housing includes a sound port therethrough. The electronic component is mounted on the bottom surface of the housing adjacent the electrical terminals.

In another embodiment, a component assembly includes a conversion substrate and an acoustic transducer component with a housing and an acoustic transducer disposed therein. The housing includes an exterior top surface and an exterior bottom surface opposite the exterior top surface. The housing includes a plurality of electrical terminals disposed on the exterior bottom surface of the housing. The conversion substrate includes a first portion attached to the exterior top surface of the housing. The first portion of the conversion substrate includes a plurality of electrical pads disposed on a side of the conversion substrate opposite the housing. At least one of the plurality of electrical pads is electrically connected to at least one of the plurality of electrical terminals.

BRIEF DESCRIPTION OF THE DRAWINGS

FIG. 2A shows a cross-sectional view of one example of a bottom-port acoustic transducer component.

FIG. 2B shows a cross-sectional view of one example of a top-port acoustic transducer component.

FIG. 7 shows one embodiment of a top-port component and a flexible substrate in an exploded top perspective view.

FIG. 8A shows another embodiment of a top-port component and a flexible substrate in an exploded top perspective view.

FIG. 8B shows an exploded bottom perspective view of the top-port component and flexible substrate of FIG. 8A, where the flexible substrate includes a semiconductor die.

FIGS. 12A-12H show cross sectional views of component assemblies according to various embodiments.

DETAILED DESCRIPTION OF EMBODIMENTS

Figure 1A:
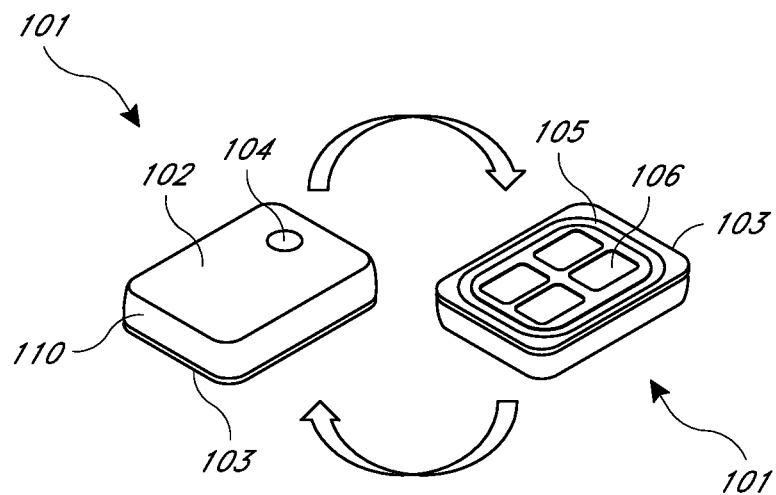
FIG. 1A shows top and bottom perspective views of a top-port acoustic transducer component or package.

Packages and methods of packaging microphone devices are disclosed herein. In one aspect, a component assembly comprises an acoustic transducer component or package with a housing and an acoustic transducer disposed therein. The housing includes a rigid substrate with first and second surfaces opposite each other. The housing has an exterior top surface, and the rigid substrate is disposed with its second surface as an exterior bottom surface of the housing. Electrical terminals are disposed on the second surface of the rigid substrate. The component assembly further comprises a flexible substrate having a first portion and a second portion and being flexible at least between the first and second portion, each portion with opposing sides. The flexible substrate is folded around the acoustic transducer component with its first portion overlaying and attached to the exterior top surface and its second portion at least partially overlaying and attached to the exterior bottom surface, and the flexible substrate is provided with electrically conductive traces exposed on the side of the first portion that faces away from the housing and connecting to at least one of the electrical terminals.

Consequently, a more versatile utilization of the acoustic transducer component, which may be a conventional acoustic transducer, is achieved. For example, acoustic transducer components configured for top-mount and provided with a flexible substrate in a component assembly can be used in a bottom-mount configuration. Likewise, components configured for bottom-mount can be used for top-mount configurations. Effectively, flexible substrates can be employed for converting top-mount packages, which may have already been designed or produced, into bottom-mount packages, and vice versa. Thus, more versatile utilization is possible without alteration of the construction of the acoustic transducer component.

Since it is thereby possible to use the component assembly with a top-port transducer component as a bottom-port component, and vice versa, the previous design lock-in to use one of the two types can be overcome. Thus, the use of a top-port type microphone, which is typically an electret condenser microphone, or bottom-port type microphone, which is typically a MEMS device, can be decided from its respective and different properties and qualities.

The flexible substrate can be made from one or more film layers and comprises one or more conductive layers with electrically conductive traces. The flexible substrate, at least between the first and second portion, has a much lower modulus than the rigid substrate. For instance, but not limited thereto, the flexible substrate may have a Young's modulus of 5 GPa whereas the rigid substrate may have a Young's modulus of 25 GPa. The flexible substrate may be flexible in its full length or, alternatively, relatively rigid at the first and second portions while relatively flexible between the first and second portions, where it is folded. At the portion where the flexible substrate is flexible it may bend with a radius of curvature that is, for instance, less than about 5 mm. However, in certain implementations, the radius of curvature can be smaller, for example, less than about 1 mm, or more particularly, less than about 0.6 mm.

The acoustic transducer component is also denoted as a microphone package. The housing of the acoustic transducer component can include a rigid substrate and a package lid, which may be in the form of a can or box and which at its bottom side is closed by the rigid substrate. The package lid may be made from a metal, an alloy or plastic material coated by a metal or alloy layer to provide a Faraday casing for protection against electromagnetic interference (EMI). The skilled artisan will appreciate that structures and methods disclosed herein can be applied to many other types of package housing (e.g., ceramic). In one implementation, the lid includes an intermediate printed circuit board (PCB) over the package substrate, with a hole therethrough to define the package cavity, and an upper PCB disposed over the intermediate PCB including over the hole. The intermediate PCB can operate as the walls of the lid and the upper PCB can operate at the top of the lid.

The acoustic transducer may be a microphone of the MEMS or condenser or electret condenser or piezo type, but is not limited thereto. For example, the acoustic transducer may be a pressure sensor or a loudspeaker.

The electrical terminals of the acoustic transducer component may be configured with solder pads, which can be soldered to electrical terminals or pads on a carrier board using any suitable technique, such as by using a surface mounting technology (SMT).

The electrically conductive traces connect at predefined locations (e.g., by means of solder pads) to the electrical terminals of the acoustic transducer such that electrical connection is established. Additionally, the electrically conductive traces are exposed at predefined locations (e.g. by means of solder pads) to aid in mounting the component assembly to a carrier board.

The first portion of the flexible substrate can be attached to the exterior top surface of the acoustic transducer component in any suitable way, such as by means of an adhesive. The second portion of the flexible substrate can be attached to the exterior bottom surface of the acoustic transducer component by soldering at solder pads disposed on the abutting surfaces and/or by applying an adhesive or using any other suitable technique. The adhesive may be, for example, a conductive adhesive disposed on the pads or a non-conductive adhesive disposed between at least some of the pads. A combination of solder paste and a non-conductive adhesive may also be used.

The component assembly may be a relatively small-sized component assembly for use in mobile electronic products such as mobile telephones, smart phones, lap-top or tablet computers, cameras or other devices. In some embodiments the component assembly is smaller than 13 mm×13 mm×13 mm or smaller than 5 mm×4 mm×2 mm or smaller than 4 mm×3 mm×1 mm.

In some embodiments the component assembly has a sound port extending through its housing for passage of sound pressure between the exterior of the component assembly and the acoustic transducer.

The sound port is also denoted an environmental hole and may have, for example, a circular or square-shaped opening at the external surface of the housing, though other shapes are possible. The sound port may be in the form of a hole or a channel. The sound port allows acoustic energy or pressure or pressure changes to interact between the acoustic transducer inside the housing and the atmosphere outside the housing. For example, the sound port can allow ingress of acoustic energy or pressure changes for a microphone, or egress of acoustic energy or pressure changes for a speaker. For a top-port device the sound port extends through the top surface of the housing, or a surface other than that on which the package leads are formed, whereas for a bottom-port device the sound port extends through the rigid substrate that forms the bottom side of the housing, or the same surface as that one which the package leads are formed.

In some embodiments the component assembly has a sound port with an opening through its housing and a hole through the flexible substrate, where the opening of the sound port and the hole through the flexible substrate are aligned with each other for transmitting a sound pressure between the exterior of the component assembly and the acoustic transducer.

For a bottom port device, this configuration allows the second portion of the flexible substrate to overlay the entire bottom surface of the acoustic transducer component or a substantial portion thereof, which can aid in improving the structural support of the acoustic transducer component. For example, overlaying the second portion of the flexible substrate over a substantial portion of the bottom surface of the acoustic transducer can allow the second portion of the flexible substrate to provide a sufficiently large and thus stable support for carrying the component assembly.

The opening of the sound port may have a size substantially similar to the hole in the flexible substrate. Alternatively, the opening of the sound port may be larger or smaller than the hole in the flexible substrate.

In some embodiments an electrically conductive trace runs between a first side of the first portion and the opposing side of the second portion of the flexible substrate, and the trace is routed through a vertical interconnect access (VIA).

As used herein, VIA is a vertical electrical connection between different layers of conductors in a printed circuit board design. VIAs can be pads with plated holes that provide electrical connections between traces on different layers of the board.

Including a VIA in the first portion of the flexible substrate can aid in providing electrical connectivity in the component assembly. For example, a pair of pads can be provided with one pad disposed on the first portion of the flexible substrate and the other pad disposed on the second portion of the flexible substrate. The pair of pads can be on opposing sides of the flexible substrate, and can be connected by a trace and a VIA, thereby avoiding any need to twist the flexible substrate to make the proper electrical connections.

In some embodiments the component assembly comprises a semiconductor die disposed in the housing on the first surface of the rigid substrate.

In certain implementations, the semiconductor die can be electrically shielded by the housing of the component assembly. Additionally, connections, which can be in the form of wire bonding, between the transducer element and the semiconductor die can be relatively short to aid in reducing stray capacitances that can cause signal loss.

In some embodiments the component assembly comprises a semiconductor die disposed on the portion of the flexible substrate that overlays the exterior bottom surface and is therefore outside the housing. The semiconductor die is disposed on a side of the flexible substrate opposite the housing.

Configuring the semiconductor die in this configuration can improve flexibility in application of the component assembly. In some embodiments the semiconductor die disposed on the flexible substrate is electrically connected to a semiconductor die disposed in the housing to allow communication between the dies.

In some embodiments the semiconductor die on the flexible substrate (outside the housing) is encapsulated in a glob top.

The glob top provides protection of the semiconductor die against moisture and mechanical impact. Also, in certain implementations, the glob top protects wire bonds that may connect the semiconductor die to pads and/or traces within the flexible substrate. The glob top may comprise a resin material such as an epoxy.

A metal shield enclosing the semiconductor die in a Faraday casing may be enclosed in the glob top, which can aid in providing EMI shielding of the semiconductor die.

In some embodiments the component assembly comprises a first semiconductor die disposed in the housing on the first surface of the rigid substrate, and a second semiconductor die disposed on the portion of the flexible substrate that overlays the exterior bottom surface of the housing on a side of the flexible substrate opposite the housing. In certain implementations, the first semiconductor die comprises a circuit that is configured to process analog signals and the second semiconductor die is configured to process digital signals, and the first and second semiconductor dies are electrically connected.

Disposing the first and second semiconductor dies in this configuration can improve signal quality. For example, the digital circuit can be placed at a greater distance from the analog circuit and the digital circuit can be positioned exterior to the housing where the analog circuit is disposed, thereby improving signal-to-noise ratio by reducing the effect of digital signal coupling on the analog circuitry. The semiconductor die disposed on the flexible substrate is electrically connected to the semiconductor die disposed in the housing to allow communication between them.

In some embodiments the circuit configured to process analog signals comprises a preamplifier coupled to receive an electrical signal from the acoustic transducer and to provide an analog output signal. The circuit configured to process digital signals can comprise an analog-to-digital (A-to-D) converter coupled to receive the analog output signal and to provide a digital output signal.

In some embodiments the semiconductor die comprises a circuit with an analog portion configured to process analog signals and a digital portion configured to process digital signals, and the electrical terminals disposed on the second surface of the rigid substrate comprises a first terminal electrically connected to the analog portion and a second terminal electrically connected to the digital portion.

In some implementations, the electrical terminals disposed on the second surface of the rigid substrate are configured to provide separate ground connections for analog and digital systems. Thus, a ground system for analog signals and a ground system for digital signals can be provided. Providing ground systems in this manner can aid in reducing noise, thereby improving signal-to-noise performance of the microphone device. The ground systems can be separately electrically accessible on the second surface of the rigid substrate. For example, in some implementations each ground system can be accessed using a different electrodes or pads disposed on the first portion of the flexible substrate on a side of the flexible substrate opposite the housing. Although each ground system can be electrically isolated, in some embodiments the digital and analog ground systems are interconnected within the housing.

In some embodiments a first ring-shaped electrode or pad is disposed on the second surface of the rigid substrate, and the first ring-shaped electrode encircles a second ring-shaped electrode or pad. The digital ground system can be electrically connected to the second electrode or pad and the analog ground system can be electrically connected to the first electrode or pad, or vice versa.

In some embodiments the electrical terminals disposed on the second surface of the rigid surface further comprise a third terminal, and the electrically conductive paths or traces on the flexible substrate connect to and expose the third terminal.

In some embodiments, the digital ground system is provided as the only ground system on a pad on the first portion of the flexible substrate.

In some embodiments the second portion of the flexible substrate has a smaller area than the second surface of the rigid substrate.

Thereby the second portion of the flexible substrate overlays only a smaller portion of the second surface of the rigid substrate and exposes a free portion of the second surface of the rigid structure. Consequently, the second portion of the flexible substrate does not occupy the entire second surface of the rigid substrate, thereby permitting one or more external electronic components to be disposed on the free portion of the second surface.

In some embodiments the electrical terminals disposed on the second surface of the rigid surface further comprise a fourth electrical terminal that is electrically connected to the semiconductor die within the housing. The fourth electrical terminal is exposed on the free portion or the portion of the second surface of the rigid substrate that is not covered by the flexible substrate, and at least one electrical component outside the housing is electrically connected to the fourth terminal.

Accordingly, in some implementations the rigid substrate can carry components on both sides. For example, one or more components can be disposed on the first side of the rigid substrate facing the interior of the housing, and one or more components can be disposed on the second or opposite side that serves as the exterior bottom surface of the housing. This allows arrangement of a circuit with one portion within the housing and another portion outside the housing. For example, the at least one component connected to the fourth terminals can be mounted when the housing has been manufactured, i.e., when it is closed and sealed. The component can be a component whose value can be varied or the component can be selected from among a set of components with different values to adapt the performance of the circuit on the semiconductor die to predefined specifications based on measurements of the circuit within the housing.

In some embodiments the fourth terminal is connected to the semiconductor die within the housing through the rigid substrate, such as by using a VIA.

In some embodiments a fifth electrical terminal is electrically connected to the semiconductor die within the housing and is exposed on the portion of the flexible substrate that overlays the exterior bottom surface on the side of the flexible substrate opposite the housing, and at least one electrical component is electrically connected to the fifth terminal.

Accordingly, in some implementations, a circuit for a transducer device is provided with one portion in the housing and another portion outside the housing. This is convenient since the at least one component connected to the fifth terminal can be mounted when the housing has been manufactured, i.e., when it is closed and sealed. The component can then be selected from among a set of components with different values to adapt the performance of the circuit on the semiconductor die within the housing to predefined specifications based on measurements of the circuit. Alternatively, the component can be a variable component, such as a trimmable resistor, that can have a value that is selected based on measurements of the circuit. In some implementations, the component is used to control microphone sensitivity.

In some embodiments the fifth terminal is connected to the semiconductor die within the housing through the rigid substrate and through the flexible substrate using, for example, a VIA.

In some embodiments the acoustic transducer is a microelectromechanical systems (MEMS) microphone device.

In some embodiments the acoustic transducer is a condenser microphone or an electret condenser microphone device.

Overview of Packaged Microphone Devices

Packaged microphone devices and methods of packaging the same will be described while referring to the accompanying drawings. Like parts and components are designated by the same reference numerals for the reader's ease. The drawing are schematic and not to scale.

FIG. 1A shows top and bottom perspective views of a top-port acoustic transducer component or package. In FIG. 1A the acoustic transducer component shown is a top-port microphone package 101, with a housing that includes a package lid 110 and a rigid substrate 103. Reference numeral 102 designates an exterior top surface of the housing, opposite the leads or terminals. A sound port 104 extends through the housing for passage of sound pressure between the exterior of the housing and an acoustic transducer (not shown in this figure) disposed inside the housing.

The rigid substrate 103 has a first surface facing the interior of the housing and a second surface facing the exterior of the housing and that defines the exterior bottom surface of the housing. Electrical leads or terminals are disposed on the second surface of the rigid substrate. In the illustrated configuration, the electrical terminals comprise five terminals with four of them arranged as square-shaped terminals 106 and with the fifth terminal arranged as a ring-shaped terminal 105. The terminals are connected through the substrate 103 to the acoustic transducer (not shown) disposed inside the housing. The acoustic transducer may be connected directly and/or using an electrical circuit arranged on a semiconductor die (not shown) disposed on the first side of the substrate 103.

The acoustic transducer component is also designated a package or a packaged microphone.

Figure 1B:
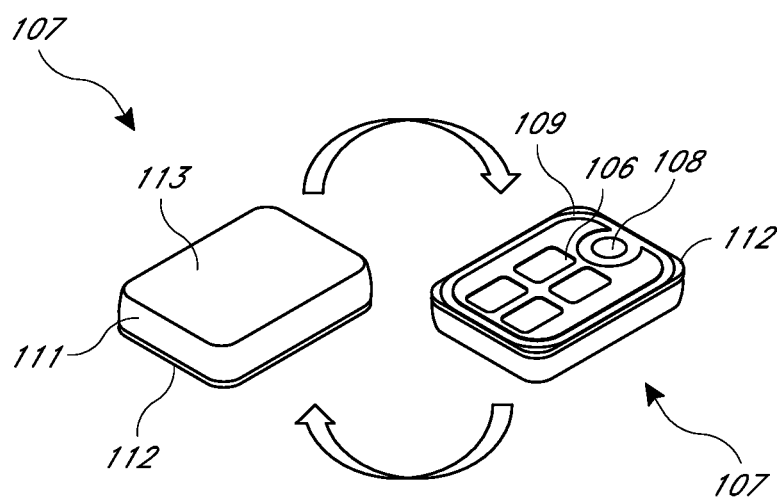
FIG. 1B shows top and bottom perspective views of a bottom-port acoustic transducer component.

FIG. 1B shows top and bottom perspective views of a bottom-port acoustic transducer component. In FIG. 1B the acoustic transducer component shown is a bottom-port microphone package 107, with a housing that includes a package lid 111 and a rigid substrate 112. The package lid 111 includes an exterior top surface 113. The bottom-port microphone package 107 has its sound port 108 disposed through the bottom surface of the housing, which in this case is through the rigid substrate 112. In the illustrated configuration, the electrical terminals on the bottom surface comprise five terminals whereof four of them are arranged as square-shaped terminals 106 and where the fifth is arranged as a ring-shaped terminal 109 with a circular portion that encircles the opening of the sound port 108.

FIG. 2A shows a cross-sectional view of one example of a bottom-port acoustic transducer component. FIG. 2B shows a cross-sectional view of one example of a top-port acoustic transducer component. The bottom-port component 107 shown in FIG. 2A is mounted on a carrier board 201 in the form of a printed circuit board (PCB), which may be a rigid PCB, e.g., a type FR-4 board. The bottom-port component 107 includes a package lid 111 and a rigid substrate 112. The sound port 108 extends through the rigid substrate 112 of the component, i.e., through the bottom surface of the housing for passage of sound pressure between the exterior of the housing and an acoustic transducer 204 disposed inside the housing. A semiconductor die 207 is also disposed inside the housing, and is electrically connected to the acoustic transducer 204 using a bondwire 210. The carrier board 201 comprises a hole or aperture 203 aligned with the opening of the sound port 108 of the component to allow the passage of sound pressure. The acoustic transducer 204 is of the MEMS type, but is not limited thereto; it may also be, e.g., a condenser or electret condenser type or a piezo type. Leads or terminals 211 are shown on the rigid substrate 112 that forms the back-side of the component, mounted and connected to pads 212 on the carrier board 201.

Although FIG. 2A illustrates a space between the terminals 211 and the pads 212 for clarity of the different parts, the terminals 211 and the pads 212 are attached to one another when the bottom-port component 107 is mounted on the carrier board 201. For example, after the bottom-port component 107 is mounted on the carrier board 201, the terminals 211 and the pads 212 can be directly attached to one another or attached to one another through an intervening (conductive) adhesive, such as solder. Other figures herein, including, for example, FIGS. 2B, 3A, 4A, 12A-12E and 12H, have also illustrated a space between attached or abutting components for clarity of the different parts and for the reader's ease. However, persons having ordinarily skill in the art will appreciate that components herein described as attached or abutting can physically contact one another directly or through an intervening adhesive.

The top-port component 101 shown in FIG. 2B is mounted on a carrier board 202. The acoustic transducer is of the electrets condenser type and comprises a back-plate 205 and a membrane 206 which moves in response to a sound pressure acting on it through the sound port 104 in the lid 110. Alternatively, it may be a condenser, a MEMS or a piezo type. The back-plate 205 and membrane 206 are shown supported by stand-offs 215. Leads or terminals 213 are shown on the rigid substrate 103 that forms the back-side of the component, mounted and connected to pads 214 on the carrier board 202. A semiconductor die 208 is also mounted on the rigid substrate 103 disposed inside the housing of the top-port component 101. A bondwire 209 has been used to electrically connect the semiconductor die 208 to the rigid substrate 103.

Figure 3A:
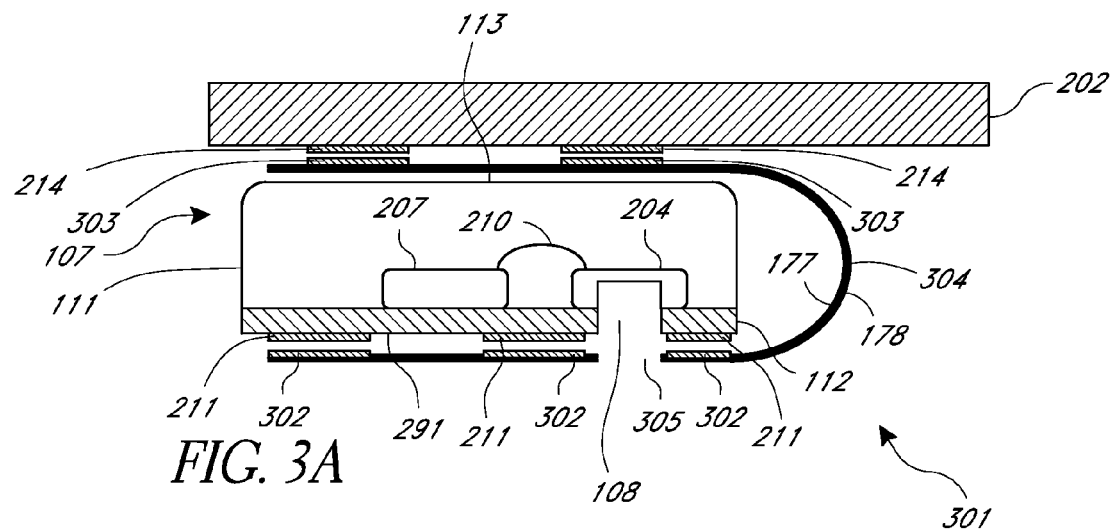
FIG. 3A shows a cross-sectional view of one embodiment of a component assembly comprising a bottom-port acoustic transducer component and a flexible substrate, converting it into a top-port configuration.
Figure 3B:
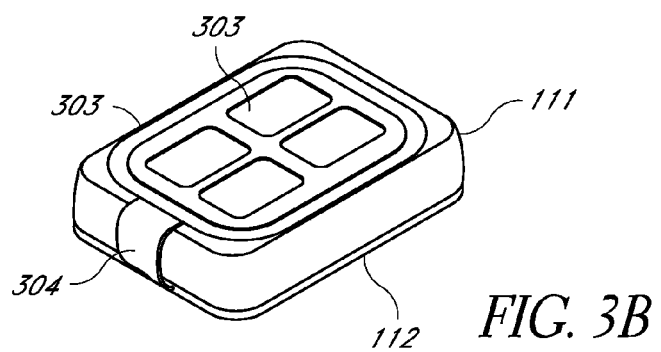
FIG. 3B shows a perspective view of the bottom-port acoustic transducer component of FIG. 3A.

FIG. 3A shows a cross-sectional view of one embodiment of a component assembly comprising a bottom-port acoustic transducer component and a flexible substrate that serves as a conversion substrate for converting the component into a top-port configuration. FIG. 3B shows a perspective view of the bottom-port acoustic transducer component of FIG. 3A. The component assembly 301 comprises an acoustic transducer component 107 with a MEMS-type acoustic transducer 204 and a housing that includes a package lid 111 and a rigid substrate 112. A semiconductor die 207 is disposed on a first surface of the substrate 112 within the housing, and is electrically connected to the acoustic transducer 204 by means of wires 210 bonded to the die 207 and the transducer 204. Electrical terminals 211 are disposed on bottom surface 291 of the housing, on the exterior or second side of the substrate 112. The electrical terminals 211 can be electrically connected to the semiconductor die 207 and/or the acoustic transducer 204.

Additionally, the transducer component comprises a flexible substrate 304 that is folded around the acoustic transducer component 107. The flexible substrate 304 abuts the exterior top surface 113 of the housing with its first side 177 at one end of the flexible substrate and abuts the exterior bottom surface 291 of the housing with its first side 177 at the other end of the flexible substrate. The flexible substrate 304 abuts the exterior top and bottom surfaces 113, 291 of the component 107 at respective first and second portions. The flexible substrate 304 is flexible at least in a middle portion disposed between the first or top portion and the second or bottom portion. As can be seen from the figure, the flexible substrate 304 can be curved in the middle portion where it is folded. The flexible substrate is shown to have a relatively loose curve, with a relatively large curvature radius, but in some embodiments it may have a tighter curve, with a relatively small radius. The flexible substrate may be flexible also at the first and second portions. For example, the flexible substrate 304 may be flexible throughout its entire length.

The flexible substrate 304 comprises electrical terminals 303 at its second side 178 at one end portion of the flexible substrate and electrical terminals 302 at its first side 177 at the other end portion. To electrically connect respective ones of the terminals 303 and respective ones of the terminals 302, the flexible substrate 304 is provided with electrically conductive traces (not shown) for electrical connection between the terminals 214 of the carrier board 202 and the terminals 211 of the component 107. As used herein, a trace electrically connected to a terminal can be referred to as being "exposed" at the terminal.

The flexible substrate 304 is attached on its first side 177 to the top exterior surface 113 of the housing by an adhesive. It is attached on its first side 177 to the bottom exterior surface 291 of the housing at the electric terminals 211 of the rigid substrate 112 by solder, solder paste and/or conductive glue. It may be further attached by non-conductive glue around the terminals, at least until a fixed electrical contact is established.

The component assembly 107 or package has a sound port with an opening 108 through its housing and a hole 305 through the flexible substrate 304, where the opening 108 of the sound port and the hole 305 through the flexible substrate 304 are aligned with each other for transmitting a sound pressure between the exterior of the component assembly 107 and the acoustic transducer 204.

As seen from FIG. 3B the flexible substrate 304 comprises a middle portion between its first and second portion abutting the top and bottom of the housing, which comprises the lid 111 and the rigid substrate 112. The flexible substrate 304 is folded at that middle portion. As shown, the middle portion may be narrower than the first and/or second portion such that the middle portion is not as wide as the first and/or second portion. Alternatively, the flexible substrate may have substantially the same width from the one end to the other. At the middle portion the flexible substrate may be thinner or have the same thickness as the end portions.

Figure 4A:
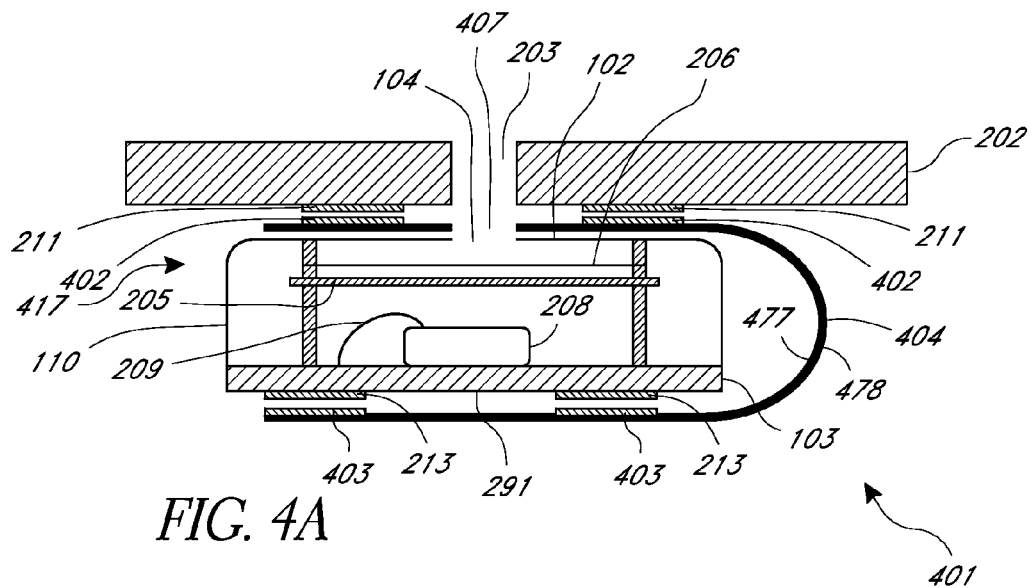
FIG. 4A shows a cross-sectional view of one embodiment of a component assembly comprising a top-port acoustic transducer component and a flexible substrate converting it into a bottom-port configuration.
Figure 4B:
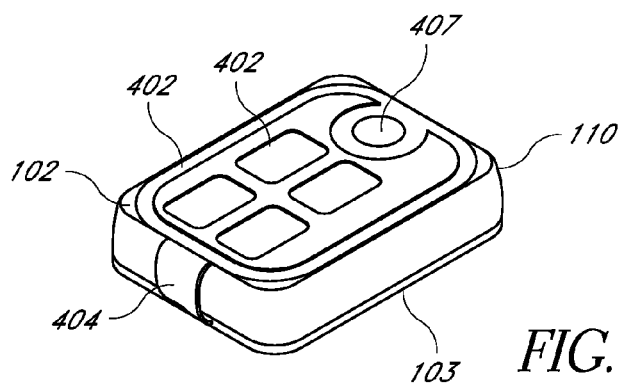
FIG. 4B shows a perspective view of the top-port acoustic transducer component of FIG. 4A.

FIG. 4A shows a cross-sectional view of one embodiment of a component assembly 401 comprising a top-port acoustic transducer component 417 and a flexible substrate 404. The flexible substrate 404 serves as a conversion substrate for converting the top-port component into a bottom-port configuration. FIG. 4B shows a perspective view of the top-port acoustic transducer component 401 of FIG. 4A.

The component assembly 401 comprises an acoustic transducer component 417 with a housing that includes a package lid 110 and a rigid substrate 103, and an acoustic transducer of the condenser or electret condenser type with a back plate 205 and a membrane 206. A semiconductor die 208 is disposed on the interior or first side of the substrate 103 and electrically connected to the acoustic transducer by means of wires 209 bonded to the die and the transducer. Electrical terminals 213 are disposed on the rigid substrate 103, on the exterior or second side of the substrate. The electrical terminals 213 are electrically connected to the semiconductor die 208 and/or the acoustic transducer.

Additionally, the transducer component assembly 401 comprises a flexible substrate 404 that is folded around the acoustic transducer component 417. The flexible substrate 404 abuts the exterior top surface 102 of the housing with its first side 477 at one end of the flexible substrate and abuts the exterior bottom surface 291 of the housing with its first side 477 at the other end of the flexible substrate. The flexible substrate 404 abuts the exterior top and bottom surfaces 102, 291 of the component 417 at a first or top portion and a second or bottom portion, respectively. It is flexible at least in a middle portion disposed between the first and second portions.

The flexible substrate comprises electrical terminals 402 at its second side 478 at one end portion of the flexible substrate and electrical terminals 403 at its first side 477 at the other end portion. To electrically connect respective ones of the terminals 402 and respective ones of the terminals 403, the flexible substrate 404 is provided with electrically conductive traces (not shown) for electrical connection between the terminals 211 of the carrier board 202 and the terminals 213 of the component 417.

The flexible substrate 404 is attached on its first side 477 to the exterior top surface 102 of the housing by an adhesive. It is attached on its first side 477 to the exterior bottom surface 291 of the housing at its electric terminals by solder, solder paste or conductive glue. It may be further attached by non-conductive glue around the terminals, at least until a fixed electrical contact is established.

The component assembly 401 has a sound port with an opening 104 through its housing and a hole 407 through the flexible substrate 404, where the opening of the sound port and the hole through the flexible substrate are aligned with each other for transmitting a sound pressure between the exterior of the component assembly and the acoustic transducer. Further, the carrier board 202 is configured with a hole 203, which is aligned with the opening 104 through the housing and the hole 407 through the flexible substrate 404.

As seen from FIG. 4B the flexible substrate 404 comprises a middle portion between its first and second portion abutting the top and bottom of the housing, which comprises the lid 110 and the rigid substrate 103. The flexible substrate 404 is folded at that middle portion. As shown, the middle portion may be narrower than the first and/or second portion such that the middle portion is not as wide as the first and/or second portion. Alternatively, the flexible substrate may have substantially the same width from the one end to the other. At the middle portion the flexible substrate may be thinner or have the same thickness as the end portions.

Figure 5:
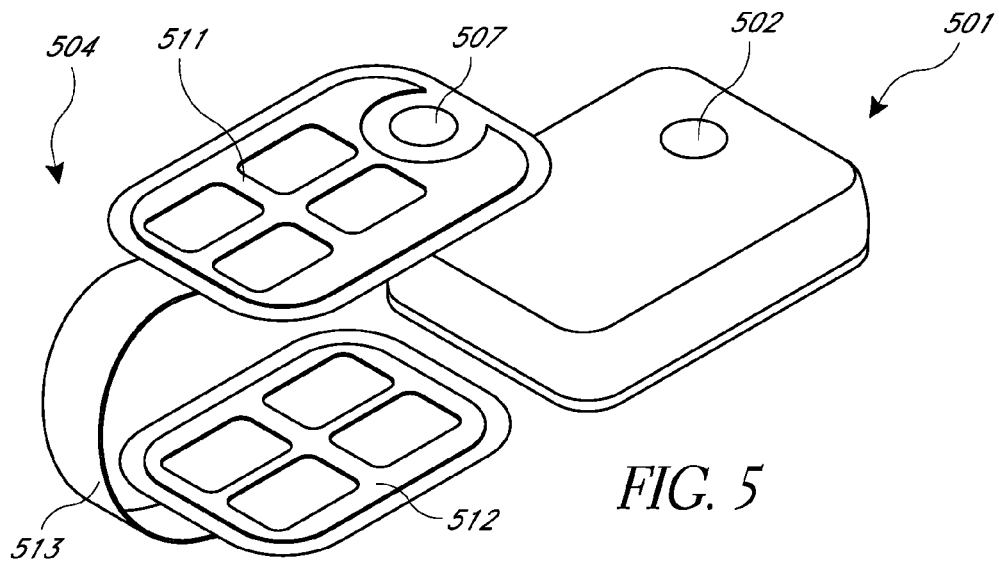
FIG. 5 shows one embodiment of a top-port component and a flexible substrate in an exploded perspective view.

FIG. 5 shows one embodiment of a top-port component 501 and a flexible substrate 504 in an exploded perspective view. The flexible substrate 504 comprises two end-portions each provided with electrical terminals, but at sides opposite each other. For example, a first or top end-portion 511 includes electrical terminals disposed on a side of the flexible substrate opposite the housing of the component 501, while a second or bottom end-portion 512 includes electrical terminals disposed on a side of the flexible substrate facing the housing of the component 501. The top end-portion 511 includes a hole 507 through the flexible substrate 504, which can be aligned with a hole 502 in the housing of the component 501 when the flexible substrate 504 is attached to the top-port component 501. As illustrated in FIG. 5, a flexible middle portion 513 of the flexible substrate 504 connects the top end-portion 511 and the bottom end-portion 512. The middle portion 513 can have a width that is less than a width of the top and bottom end-portions 511, 512. In certain implementations, the bottom portion 512 fully covers the external bottom surface of the component 501.

Figure 6:
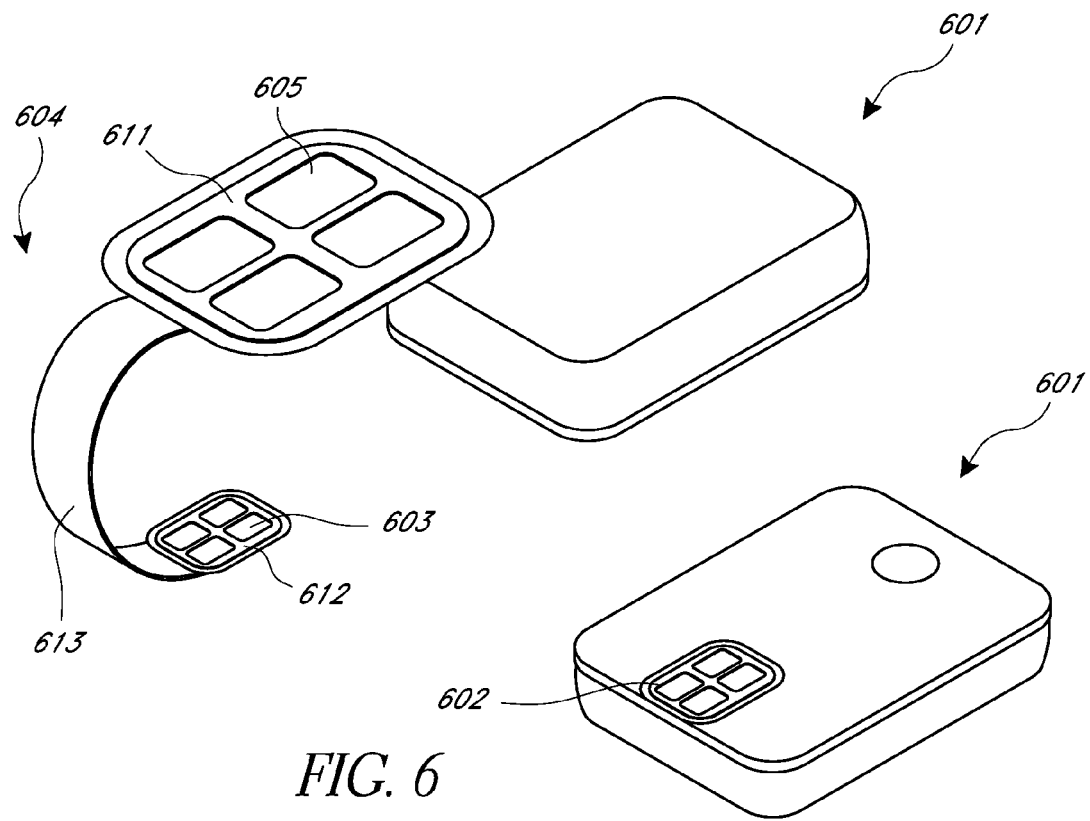
FIG. 6 shows one embodiment of a bottom-port component and a flexible substrate in an exploded view, where the bottom-port component is shown also from its bottom side.

FIG. 6 shows one embodiment of a bottom-port component 601 and a flexible substrate 604 in an exploded view, where the bottom-port component 601 is shown also from its bottom side. One end-portion of the flexible substrate 604 is smaller than the other end-portion. For example, the flexible substrate 604 includes a first or top end-portion 611 and a second or bottom end-portion 612, and the top end-portion 611 has a larger area than the bottom end-portion 612. The electrical terminals 602 of the acoustic transducer component are arranged within a smaller area than the bottom surface of the transducer component. Correspondingly, the electrical terminals 603 of the bottom end-portion 612 of the flexible substrate 604 are arranged within the smaller area to at least substantially match the layout of the terminals 602 of the bottom-port component 601. The terminals 605 on top end-portion 611 of the flexible substrate 604 are arranged on a larger area that can have substantially the same size as the top surface of the component 601. The top and bottom end-portions 611, 612 of the flexible substrate are connected by a flexible middle portion 613.

FIG. 7 shows one embodiment of a top-port component 701 and a flexible substrate 704 in an exploded top perspective view. The flexible substrate 704 includes a first or top end-portion 711 and a second or bottom end-portion 712, and the top end-portion 711 has a larger area than the bottom end-portion 712. The top end-portion 711 includes electrical terminals 705 on a side of the flexible substrate 704 that faces away from the housing of the component 701. The bottom-end portion includes electrical terminals 703 on an opposite side of the flexible substrate 704 that faces toward the housing of the component 701. The electrical terminals 703 of the bottom end-portion 712 of the flexible substrate 704 are arranged within a smaller area relative the area that the electrical terminals 705 of the top end-portion 711. The top and bottom end-portions 711, 712 of the flexible substrate are connected by a flexible middle portion 713. In the illustrated embodiment, the flexible substrate 704 is used in combination with a top-port component 701, are comprises a hole 707 in the top end-portion 711 that is aligned with a sound port 702 of the component 701 when the flexible substrate 704 is attached to the component 701.

FIG. 8A shows another embodiment of a top-port component 801 and a flexible substrate 804 in an exploded top perspective view. FIG. 8B shows an exploded bottom perspective view of the top-port component 801 and the flexible substrate 804 of FIG. 8A, where the flexible substrate includes a semiconductor die 851. The flexible substrate 804 includes a first or top end-portion 811 and a second or bottom end-portion 812, and the top end-portion 811 has a larger area than the bottom end-portion 812. The top end-portion 811 includes electrical terminals 805 on a first side of the flexible substrate 804 that faces away from the housing of the component 801. The bottom-end portion 812 includes electrical terminals 803 on a second or opposite side of the flexible substrate 804 that faces toward the housing of the component 801. The electrical terminals 803 of the bottom end-portion 812 of the flexible substrate 804 are arranged within a smaller area relative the area that the electrical terminals 805 of the top end-portion 811. The top and bottom end-portions 811, 812 of the flexible substrate 804 are connected by a flexible middle portion 813. In this embodiment, the flexible substrate 804 is used in combination with a top-port component 801, are comprises a hole 807 that is aligned with the sound port 802 of the component 801 when the flexible substrate 804 is attached to the component 801.

The component assembly comprises a semiconductor die 851 that is disposed on a portion of the flexible substrate 804 that overlays the exterior bottom surface of the component 801. In some implementations, a glob-top can enclose the semiconductor die 851. The semiconductor die 851 can be electrically connected to the component 801 using the terminals 803 that are disposed on the bottom end-portion 812 of the flexible substrate 804. For example, an exterior bottom surface of the component 801 can include terminals 852 that are configured to mate with the terminals 803 disposed on the bottom-portion 812.

As described earlier, in some implementations the semiconductor die 851 can be enclosed in a metal shield or other Faraday casing or cage so as to provide EMI shielding to the semiconductor die. The semiconductor die and the metal shield can additionally be enclosed in a glob top. In one embodiment, one or more external components 806 are mounted on the first side of the flexible substrate 804 adjacent the semiconductor die 851. Additional details of the external components 806 can be as described below with respect to the external components 902 of FIG. 9. Although FIG. 8B illustrates the external components 806, in some implementations the external components 806 need not be included.

Figure 9:
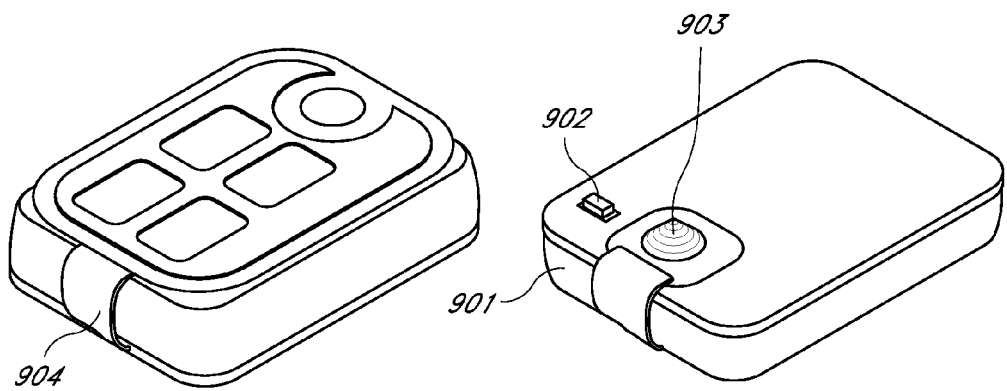
FIG. 9 shows top and bottom perspective views of one embodiment of a component assembly comprising a flexible substrate and a component mounted on the bottom-surface of a rigid substrate of a transducer component.

FIG. 9 shows top and bottom perspective views of one embodiment of a component assembly comprising a flexible substrate 904 and an exterior component 902 mounted on the bottom-surface of a rigid substrate of a transducer component 901. The component 902 can be used for a variety of purposes. For example, the component 902 can be an electrical component that is selected from among a set of electrical components with different values (e.g., resistances) to adapt the performance of the transducer disposed within the housing of the component 901. In one embodiment, the component 902 has a value that is selected to vary the sensitivity of the transducer so as to compensate for a manufacturing variation of the transducer. For instance, the sensitivity of the transducer can be measure after closing and sealing the transducer component 901, and the value of the exterior component 902 can be selected to tune the sensitivity of the transducer to a desired value. In certain implementations, the exterior component 902 is a trimmable electrical component. For instance, the exterior component 902 can be a resistor than can be trimmed to a desired resistance using a laser. In some implementations, the exterior component 902 can be encapsulated in a glob top, such as after the component has been trimmed.

In addition to or as an alternate to the illustrated exterior component 902 that is mounted on the exterior bottom surface of the transducer component 901, a semiconductor die and/or an exterior component can be mounted on the flexible substrate 904. For example, the semiconductor die and/or exterior component can be mounted on a side of the flexible substrate 904 opposite the transducer component 901, and can be encapsulated in a glop top 903. Accordingly, in some implementations an exterior component can be mounted on a surface of the flexible substrate 904 opposite the exterior bottom surface of the transducer component 901 and/or can be mounted on the exterior bottom surface of the transducer component 901.

Figure 10:
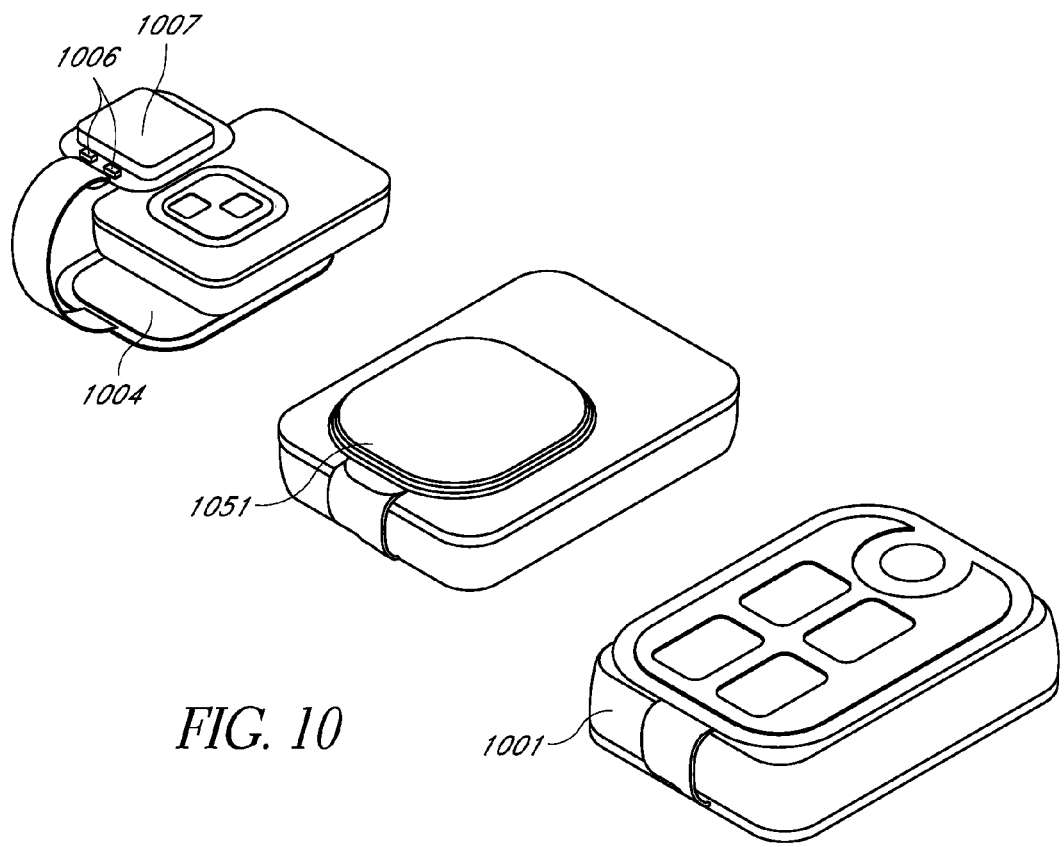
FIG. 10 shows an exploded bottom perspective view, a bottom perspective view, and a top perspective view of one embodiment of a component assembly comprising a transducer component and a flexible substrate having a semiconductor die disposed on the flexible substrate and embedded in a glob-top.

FIG. 10 shows an exploded bottom perspective view, a bottom perspective view, and a top perspective view of one embodiment of a component assembly comprising a transducer component 1001 and a flexible substrate 1004 having a semiconductor die disposed on the flexible substrate and embedded in a glob-top 1051. In the exploded bottom perspective view, the semiconductor die 1007 is illustrated before being encapsulated in the glop top 1051, which is shown in the bottom perspective view. Additionally, the electrical components 1006 are illustrated as being disposed within the glop top 1051. Although two exterior components 1006 are illustrated in the exploded bottom perspective view, more or fewer exterior components 1006 can be included, or the exterior components 1006 can be omitted. Additional details of the exterior components 1006 can be as described above.

Figure 11:
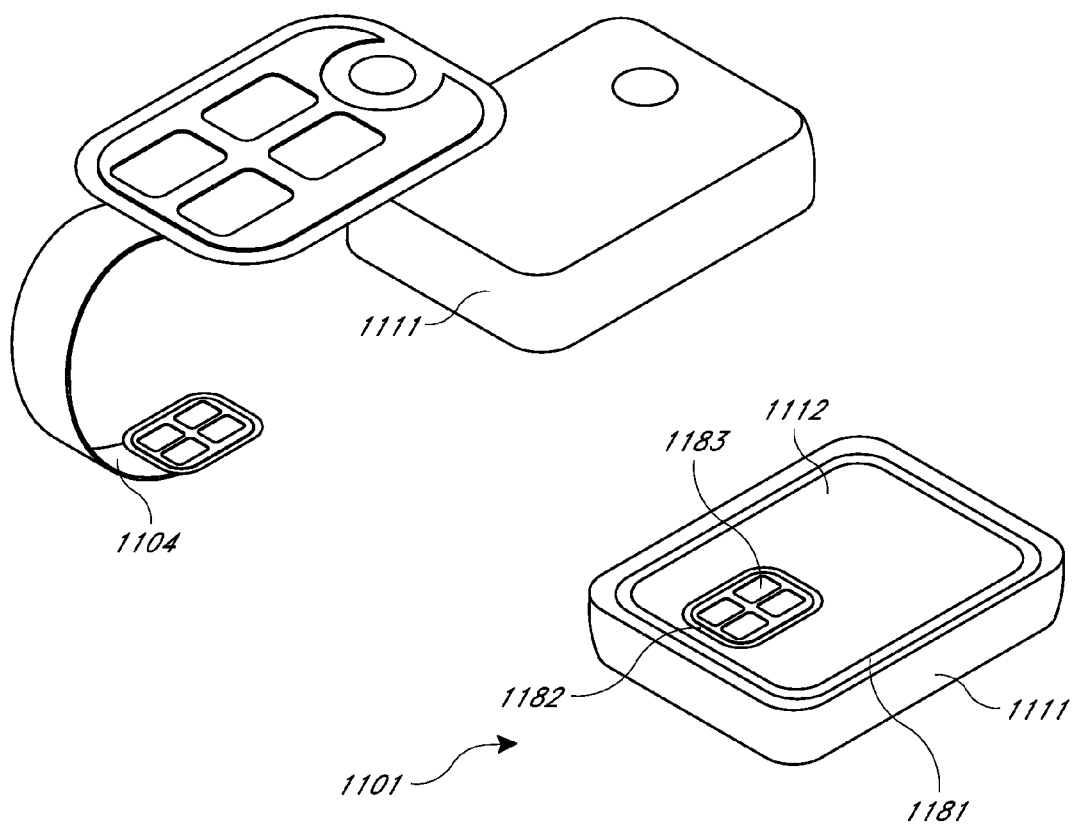
FIG. 11 shows an exploded top perspective view and a bottom perspective view of one embodiment of flexible substrate and a transducer component with two ground reference electrodes configured as ring shapes.

FIG. 11 shows an exploded top perspective view and a bottom perspective view of one embodiment of a flexible substrate 1104 and a transducer component 1101 with two ground reference electrodes configured as ring shapes. The transducer component 1101 includes a housing comprising a lid 1111 and a rigid substrate 1112. The transducer component 1101 comprises an exterior top surface defined by a portion of the lid 1111. Additionally, the transducer component comprises an exterior bottom surface defined by the rigid substrate 1112 and a portion of the lid 1111. The rigid substrate 1112 includes an exterior surface having terminals 1183 disposed on the exterior surface. A first ground terminal 1182 surrounds the terminals 1183. A second ground terminal 1181 surrounds the first ground terminal 1182 and is disposed along a perimeter of the rigid substrate 1112.

FIGS. 12A-12H show cross sectional views of component assemblies according to various embodiments.

Figure 12A:
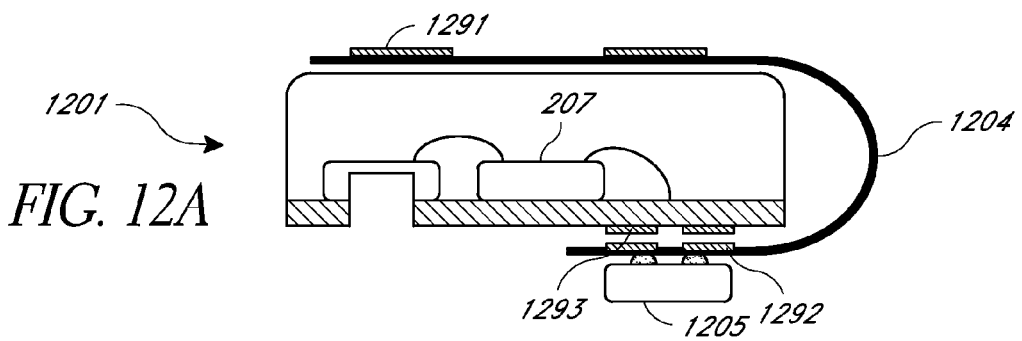

In FIG. 12A, a component assembly includes a transducer component 1201 and a flexible substrate 1204. The transducer component 1201 is a bottom-port microphone, and includes pads or terminals 1293 disposed on a bottom exterior surface of the transducer component 1201. The flexible substrate 1204 includes first terminals 1291 on a first surface of the flexible substrate 1204 facing away from the housing of the transducer component 1201. The flexible substrate further includes second terminals 1292 on a second surface of the flexible substrate opposite the first. The second terminals 1292 are configured to mate with the first terminals 1293 disposed on the exterior bottom surface of the transducer component 1201. The flexible substrate further includes an electronic component 1205 disposed on the second surface of the flexible substrate that faces opposite the housing of the transducer component 1201. The electronic component 1205 can be a semiconductor die and/or a passive electronic component. In certain implementations, the electronic component 1205 includes both a semiconductor die and a passive component mounted adjacent the semiconductor die.

In certain implementations, the transducer component includes a first die 207 disposed within the housing, and the electronic component 1205 includes a second die. The first die 207 can be configured to process analog signals and the second die can be configured to process digital signals. By placing a second die external to the transducer component 1201, digital circuitry disposed on the second die can be placed at a greater distance from the analog circuit disposed on the first die 207, thereby improving signal-to-noise ratio of the packaged microphone device by reducing the effect of digital signal coupling on the analog circuitry. The semiconductor die disposed on the flexible substrate is electrically connected to the semiconductor die disposed in the housing to allow communication between them. For example, the flexible substrate 1204 can include traces (not shown) that can electrically connect the electronic component 1205 to the second terminals 1292. In some embodiments, the first die 207 comprises a preamplifier coupled to receive an electrical signal from the acoustic transducer and to provide an analog output signal. The second die can comprises an analog-to-digital (A-to-D) converter coupled to receive the analog output signal and to provide a digital output signal. In some implementations, the semiconductor die mounted on the flexible substrate is encapsulated in a glob top.

Figure 12B:
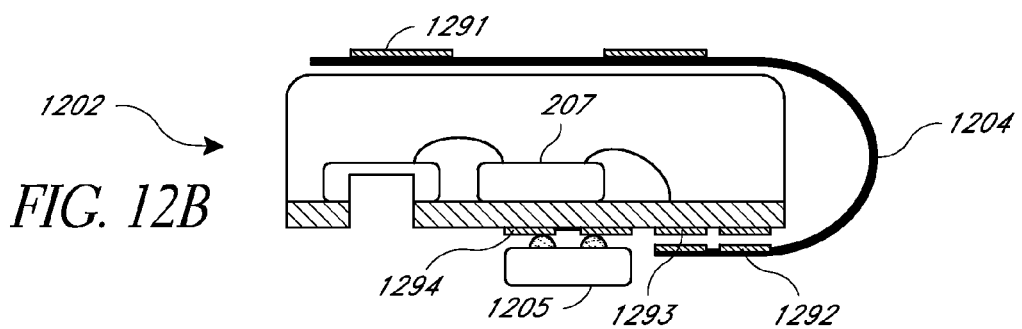

In FIG. 12B, a component assembly includes a transducer component 1202 and a flexible substrate 1204. The component assembly of FIG. 12B is similar to the component assembly of FIG. 12A. However, in the configuration illustrated in 12B, the transducer component 1202 further includes additional or second terminals 1294 disposed adjacent the terminals 1293. Additionally, the electronic component 1205 has been attached to the second terminals 1294 rather than mounted on the flexible substrate 1204. In some implementations, the electronic component 1205 includes a semiconductor die mounted on the exterior bottom surface of the transducer component and encapsulated in a glob top. In certain implementations, the electronic component 1205 includes both a semiconductor die and a passive component mounted adjacent the semiconductor die.

Figure 12C:
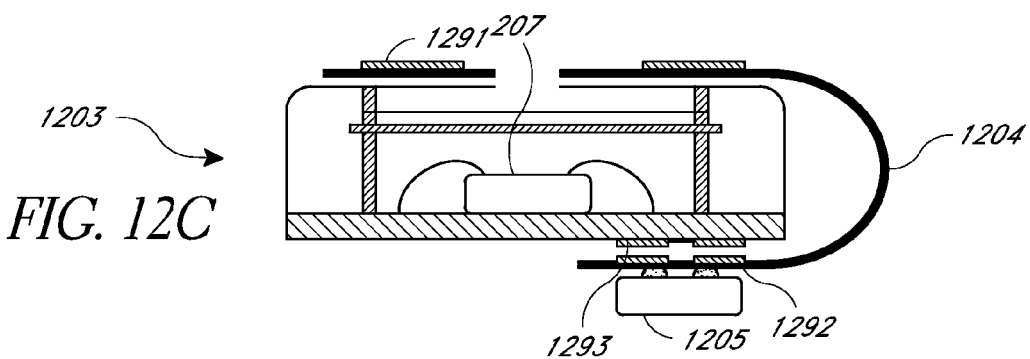

In FIG. 12C, a component assembly includes a transducer component 1203 and a flexible substrate 1204. The component assembly of FIG. 12C is similar to the component assembly of FIG. 12A. However, in the configuration illustrated in 12B, the transducer component 1203 is a top port microphone including a condenser microphone. In some implementations, the electronic component 1205 includes a semiconductor die mounted on the flexible substrate and encapsulated in a glob top. In certain implementations, the electronic component 1205 includes both a semiconductor die and a passive component mounted adjacent the semiconductor die. In other implementations, the electronic component 1205 includes only a passive electrical component, such as a trimmable resistor.

Figure 12D:
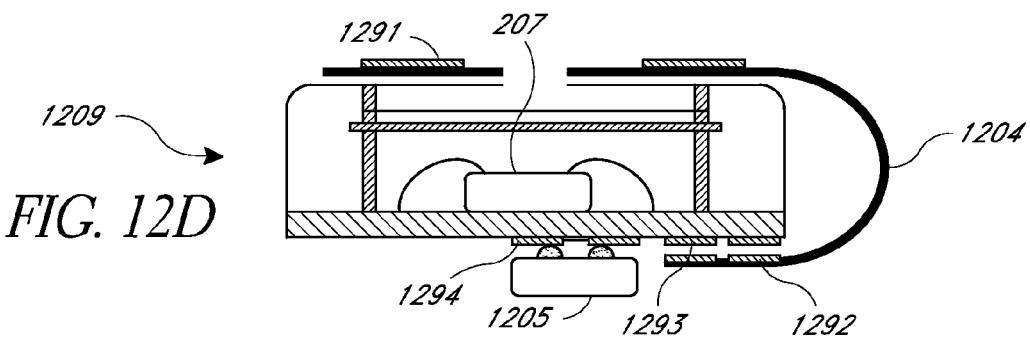

In FIG. 12D, a component assembly includes a transducer component 1209 and a flexible substrate 1204. The component assembly of FIG. 12D is similar to the component assembly of FIG. 12B. However, in the configuration illustrated in 12D, the transducer component 1209 is a top port microphone including a condenser microphone. In some implementations, the electronic component 1205 includes a semiconductor die mounted on the exterior bottom surface of the transducer component is encapsulated in a glob top. In certain implementations, the electronic component 1205 includes both a semiconductor die and a passive component mounted adjacent the semiconductor die. In other implementations, the electronic component 1205 includes only a passive electrical component, such as a trimmable resistor.

In FIG. 12E, a component assembly includes a transducer component 1298 and a flexible substrate 1204. The component assembly of FIG. 12E is similar to the component assembly of FIG. 12A. However, in the configuration illustrated in 12E, the transducer component 1298 further includes additional or second terminals 1294 disposed adjacent the first terminals 1293. Additionally, a second electronic component 1206 has been attached to the second terminals 1294. Thus, FIG. 12E illustrates a configuration in which a first electronic component 1205 has been attached to the flexible substrate 1204 and a second electronic component 1206 has been attached to an exterior bottom surface of the transducer component 1298. The first and second electronic components 1205, 1206 can each include a passive component, can each include a semiconductor die, can each include a passive component and a semiconductor die, or one can include a semiconductor die and the other can include a passive component. In some implementations, the first and/or second electronic components 1205, 1206 include a die encapsulated in a glob top.

In FIG. 12F, a component assembly includes a transducer component 1210 and an electronic component 1205. The transducer component 1210 is a bottom-port microphone and includes first terminals 1281 and second terminals 1282. The first terminals 1281 can be used to mount the microphone to a carrier substrate. In contrast to the component assemblies of FIGS. 12A-12E, the component assembly of FIG. 12F does not include a flexible substrate. The electronic component 1205 can include a semiconductor die and/or a passive electronic component. The electronic component 1205 is attached to the second terminals 1282.

In certain implementations, the transducer component 1210 includes a first die 207 disposed within the housing, and the electronic component 1205 includes a second die. The first die 207 can be configured to process analog signals and the second die can be configured to process digital signals. By placing a second die external to the transducer component 1210, digital circuitry disposed on the second die can be placed at a greater distance from the analog circuit disposed on the first die 207, thereby improving signal-to-noise ratio of the packaged microphone device by reducing the effect of digital signal coupling on the analog circuitry. The semiconductor die disposed on the flexible substrate is electrically connected to the semiconductor die disposed in the housing to allow communication between them. In some embodiments, the first die 207 comprises a preamplifier coupled to receive an electrical signal from the acoustic transducer and to provide an analog output signal. The second die can comprises an analog-to-digital (A-to-D) converter coupled to receive the analog output signal and to provide a digital output signal.

In FIG. 12G, a component assembly includes a transducer component 1212 and an electronic component 1205. The component assembly of FIG. 12G is similar to the component assembly of FIG. 12F. However, in the configuration illustrated in 12G, the transducer component 1212 is a top port microphone including a condenser microphone.

FIG. 12H illustrates the transducer component 1212 of FIG. 12G mounted on a carrier board 202. When the component assembly 1212 of FIG. 12G is mounted on the carrier board 202, the electronic component 1205 can at least partially be disposed in an aperture 1220 of a carrier board. The aperture 1220 can be any suitable hole in the carrier board, including a hole used as a sound port when a bottom port microphone is mounted on the carrier board. However, the aperture 1220 can be other holes or features. In certain implementations, the hole 1220 can be replaced with a recess having a depth greater than a height of the electronic component 1205.

Although FIG. 12H is illustrates mounting the transducer component 1212 of FIG. 12G on the carrier substrate 202, the transducer component 1210 of FIG. 12F can also be mounted on a carrier board. For example, the transducer component 1210 can be mounted on a carrier board that includes an additional hole aligned with the bottom sound port of the transducer component 1212.

Although FIGS. 12A-12H illustrate the electronic components 1205, 1206 as being bumped to terminals 1282, 1294 or to the flexible substrate 1204, in certain configurations, the electronic component 1205 and/or the electronic component 1206 can be mounted (e.g., bonded) on the flexible substrate and the terminals 1282, 1294 can be separately electrically connected, e.g., using a wire bonding process.

Figure 13:
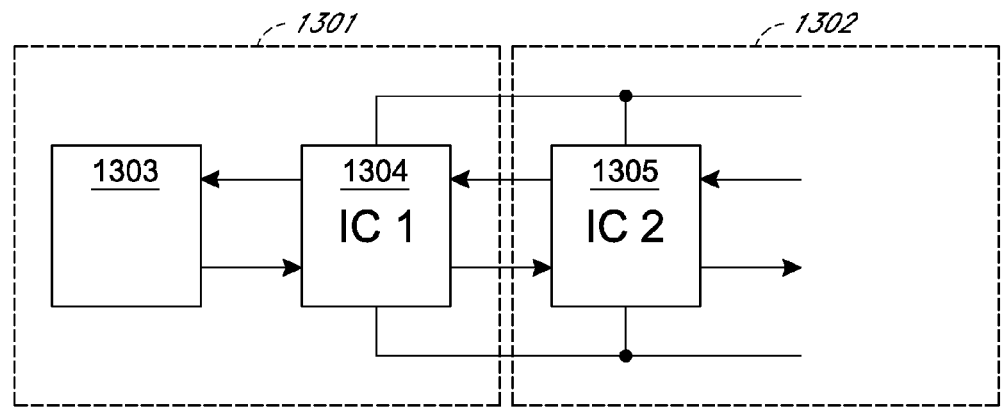
FIG. 13 shows one embodiment of an electronic circuit for a transducer device.

FIG. 13 shows an electronic circuit including a first portion 1301 and a second portion 1302. The first portion 1031 includes a first semiconductor die and the second portion 1302 includes a second semiconductor die. The first IC 1304 can be a semiconductor die located inside the housing of a transducer component. The second IC 1305 can be a semiconductor die located outside the housing of a transducer component, such as on an exterior surface of a rigid substrate of the housing. However, the second IC 1305 can also be disposed on a side of a flexible substrate that faces away from the acoustic transducer component. The transducer component is designated by reference numeral 1303 and is electrically connected to the first IC 1304 of the electronic circuit. The second IC 1305 and/or the first IC 1304 can be electrically connected to terminals of a flexible substrate.

In an embodiment the first semiconductor die, in the housing, comprises a first circuit configured to process analog signals and is electrically connected to the second semiconductor die, and the second semiconductor die comprises a second circuit configured to process digital signals. In an embodiment, the first circuit comprises an analog preamplifier electrically connected to receive an analog signal from the transducer component and to provide an analog output signal as a single-ended or balanced signal which is routed to the second IC. The second IC may comprise an analog-to-digital converter to convert the analog output signal to a digital signal. The digital signal can be supplied to circuitry (not shown) on the carrier board via traces of the flexible substrate. In some embodiments the first circuit comprises at least a portion of the analog-to-digital converter and/or receives digital control signals for controlling operation of the analog circuit.

Figure 14:
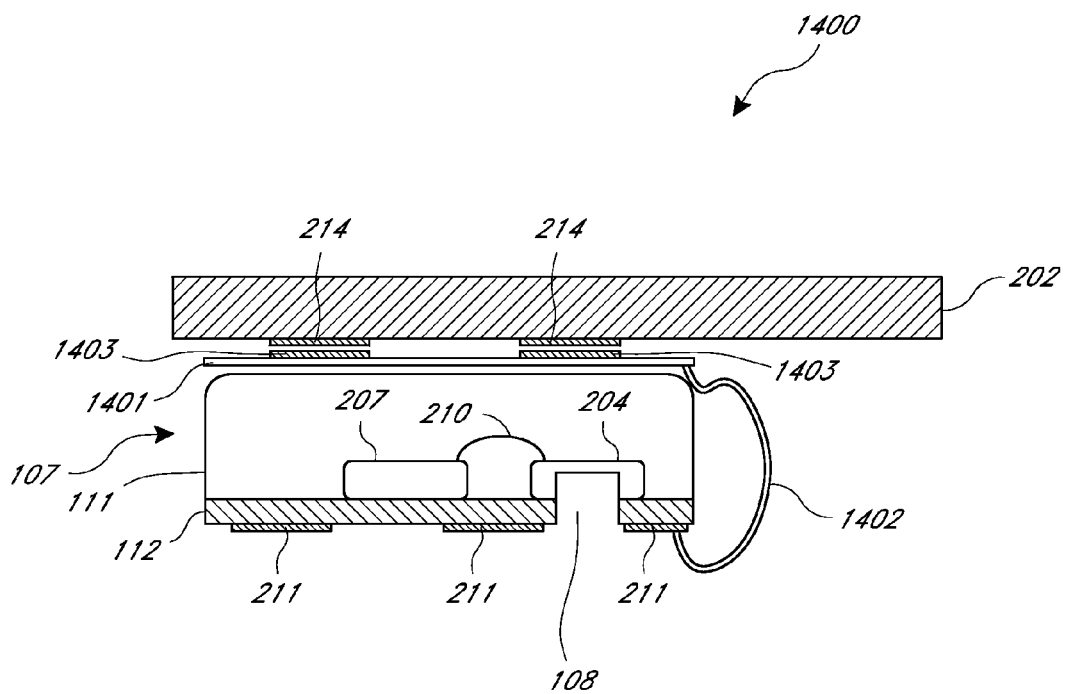
FIG. 14 shows a cross sectional view of a component assembly according to another embodiment.

FIG. 14 shows a cross sectional view of a component assembly 1400 according to another embodiment. The component assembly 1400 comprises a bottom-port microphone package 107, a conversion substrate 1401, and a carrier board 202. The bottom-port microphone package 107 includes a MEMS-type acoustic transducer 204 disposed within a package housing that includes a package lid 111 and a rigid substrate 112. A semiconductor die 207 is also disposed within the package housing, and a bondwire 210 has been used to provide electrical connections between the MEMS-type acoustic transducer 204 and the semiconductor die 207. The microphone package 107 has a sound port with an opening 108. As with previously described embodiments, the structures of FIG. 14 are useful for packaging other types of devices as well. Electrical terminals 211 are disposed on an exterior bottom surface of the package housing.

The conversion substrate 1401 has been attached to the package lid 111 on an exterior top surface of the package housing opposite the exterior bottom surface of the package housing that includes the electrical terminals 211. The conversion substrate 1401 comprises electrical terminals 1403 on a side of the conversion substrate 1401 opposite the package housing. In certain implementations, an adhesive is used to attach the package lid 111 to the conversion substrate 1401.

The electrical terminals 1403 of the conversion substrate 1401 can be electrically connected to the electrical terminals 211 of the microphone package 107 in any suitable manner. For example, in some implementations, a wire 1402 can be used to provide electrical connections between one or more of the electrical terminals 1403 of the conversion substrate 1401 and one or more of the electrical terminals 211 of the microphone package 107. For instance, the conversion substrate 1401 can include an electrical trace electrically connected to one or more of the electrical terminals 1403, and the wire 1402 can be used to electrically connect the electrical trace of the conversion substrate 1401 to the electrical terminals 211 of the microphone package 107. Although only one wire is illustrated in FIG. 14, additional wires can be used to provide additional connections between the electrical terminals 1403 of the conversion substrate 1401 and the electrical terminals 211 of the microphone package 107.

The electrical terminals 1403 of the conversion substrate 1401 can be electrically connected to the electrical terminals 211 of the microphone package 107 in other ways besides using the wire 1402, such as by using other suitable rigid or flexible conductors.

Attaching the substrate 1401 to the package housing of the bottom-port microphone package 107 on a side of the package housing opposite the terminals 211 allows the bottom-port microphone package 107 to be implemented in a top-port configuration. For example, by attaching the substrate 1401 to a side of the package housing opposite the terminals 211 and by including the electrical terminals 1403 on a side of the substrate 1401 opposite the package housing, the bottom-port microphone package 107 can be mounted to the carrier board 202 as a top-mount component. Accordingly, the substrate 1401 can be employed to convert a bottom-mount package into a top-mount package. Although FIG. 14 illustrates using the substrate 1401 to implement a bottom-port microphone package 107 as a top-port component, the substrate 1401 can be used to implement a top-port microphone package as a bottom-port component. For example, with reference back to the top-port microphone package 101 of FIG. 2B, the substrate 1401 can be attached to a side of the package lid 110 opposite the terminals 213 to implement the top-port microphone package 101 as a bottom-port component. In such configurations, the substrate 1401 can include a hole aligned with the sound port 104 of the top-port microphone package.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A component assembly, comprising:
    an acoustic transducer component with a housing and an acoustic transducer disposed therein, the housing including a rigid substrate with first and second surfaces opposite each other, wherein the housing has an exterior top surface, wherein the rigid substrate is disposed with its second surface as an exterior bottom surface of the housing, and wherein electrical terminals are disposed on the second surface of the rigid substrate; and
    a flexible substrate having a first portion and a second portion and being flexible at least between the first and second portions, each portion with opposing sides, wherein the flexible substrate is folded around the acoustic transducer component with its first portion overlaying and attached to the exterior top surface and its second portion at least partially overlaying and attached to the exterior bottom surface, and wherein the flexible substrate is provided with first electrically conductive terminals exposed on the side of the first portion that faces away from the housing and second electrically conductive terminals exposed on the side of the second portion that faces towards the housing, at least one of the second electrically conductive terminals connecting to at least one of the electrical terminals of the rigid substrate.

2. The component assembly according to claim 1, wherein the component assembly has a sound port extending through its housing for passage of sound pressure between the exterior of the component assembly and the acoustic transducer.

3. The component assembly according to claim 2, wherein the component assembly has a sound port with an opening through its housing and a hole through the flexible substrate, where the opening of the sound port and the hole through the flexible substrate are aligned with each other for transmitting a sound pressure between the exterior of the component assembly and the acoustic transducer.

4. The component assembly according to claim 1, wherein an electrically conductive trace runs between a first side of the first portion and the opposing side of the second portion of the flexible substrate, and wherein the trace is routed through a vertical interconnect access (VIA).

5. The component assembly according to claim 1, further comprising a semiconductor die disposed on the second portion of the flexible substrate on a side of the second portion facing away from the housing.

6. The component assembly according to claim 5, wherein the semiconductor die is encapsulated in a glob top.

7. The component assembly according to claim 1, wherein the second portion of the flexible substrate has a smaller area than the second surface of the rigid substrate.

8. A component assembly comprising:
    an acoustic transducer component with a housing and an acoustic transducer disposed therein, the housing including a rigid substrate with first and second surfaces opposite each other, wherein the housing has an exterior top surface, wherein the rigid substrate is disposed with its second surface as an exterior bottom surface of the housing, and wherein electrical terminals are disposed on the second surface of the rigid substrate;
    a flexible substrate having a first portion and a second portion and being flexible at least between the first and second portions, each portion with opposing sides, wherein the flexible substrate is folded around the acoustic transducer component with its first portion overlaying and attached to the exterior top surface and its second portion at least partially overlaying and attached to the exterior bottom surface, and wherein the flexible substrate is provided with electrically conductive traces exposed on the side of the first portion that faces away from the housing and connecting to at least one of the electrical terminals; and
    a semiconductor die disposed within the housing, wherein the semiconductor die comprises a circuit with an analog portion configured to process analog signals and a digital portion configured to process digital signals, and wherein the electrical terminals disposed on the second surface of the rigid substrate comprise a first terminal connected to the analog portion and a second terminal connected to the digital portion.

9. The component assembly according to claim 8, wherein the electrical terminals disposed on the second surface of the rigid surface further comprise a third terminal, and wherein the electrically conductive traces of the flexible substrate connect to the third terminal and exposes the third terminal on a side of the first portion of the flexible substrate that faces away from the housing.

10. The component assembly according to claim 9, wherein the component assembly further comprises a fourth electrical terminal electrically connected to the semiconductor die, the fourth terminal exposed on the portion of the second surface of the rigid substrate that is not covered by the flexible substrate, and wherein at least one electrical component is electrically connected to the fourth terminal.

11. The component assembly according to claim 10, wherein the component assembly further comprises a fifth electrical terminal electrically connected to the semiconductor die, the fifth terminal exposed on the portion of the flexible substrate that overlays the exterior bottom surface on the side opposite the one fixed to the exterior bottom surface, and wherein at least one electrical component is electrically connected to the fifth terminal.

12. The component assembly according to claim 1, where the acoustic transducer is configured as a Micro Electro Mechanical Systems, MEMS, device.

13. The component assembly according to claim 1, where the acoustic transducer is configured as a condenser microphone or an electret condenser microphone.

14. A method of manufacturing a component assembly comprising:
   providing an acoustic transducer component with a housing having an exterior top surface and an exterior bottom surface, wherein electrical terminals are disposed on the exterior bottom surface; and
   subsequently, attaching to the acoustic transducer component a flexible substrate having a first portion and a second portion each with opposing sides, wherein the flexible substrate is folded around the acoustic transducer component with its first portion overlaying the exterior top surface and its second portion at least partially overlaying the exterior bottom surface, and wherein the flexible substrate is provided with first electrically conductive terminals exposed on the side of the first portion that faces away from the housing and second electrically conductive terminals exposed on the side of the second portion that faces towards the housing, at least one of the second electrically conductive terminals connecting to at least one of the electrical terminals of the housing.

15. The method of claim 14, wherein providing the acoustic transducer component includes providing a first semiconductor die within the housing.

16. The method of claim 15, further comprising mounting a second semiconductor die on the exterior bottom surface of the housing.

17. The method of claim 15, further comprising mounting a passive electronic component on the exterior bottom surface of the housing.

18. The method of claim 15, further comprising mounting a second semiconductor die on the second portion of the flexible substrate on a side of the second portion opposite the housing.

19. A component assembly, comprising:
   a packaged microphone device including a housing and an acoustic transducer disposed therein, wherein the housing has an exterior top surface and an exterior bottom surface opposite the exterior top surface, and wherein the exterior bottom surface of the housing includes electrical terminals disposed thereon; and
   a flexible substrate having a top portion, a bottom portion and a flexible middle portion, the flexible middle portion disposed between the top and bottom portions, wherein the flexible middle portion is folded around the housing such that the top portion at least partially overlays and attaches to the exterior top surface of the housing and the bottom portion at least partially overlays and attaches to the exterior bottom surface of the housing, and wherein the flexible substrate includes a first electrical terminal that faces away from the housing and a second electrical terminal that faces towards the housing, the second electrical terminal electrically connected to at least one of the electrical terminals of the housing.

20. The component assembly according to claim 19, wherein the housing includes a rigid substrate that includes a first surface and a second surface opposite the first, wherein the second surface of the rigid substrate defines the exterior bottom surface of the housing.

21. The component assembly according to claim 20, further comprising a sound port disposed on the top exterior surface of the housing.

22. The component assembly according to claim 21, wherein the first portion of the flexible substrate includes a hole aligned with the sound port.

23. The component assembly according to claim 20, further comprising a sound port disposed on the bottom exterior surface of the housing.

24. The component assembly according to claim 20, wherein the flexible middle portion of the flexible substrate has a width that is less than a width of the top and bottom portions.

25. The component assembly according to claim 19, further comprising a first die mounted within the housing and a second die mounted on a side of the second portion of the flexible substrate opposite the housing.

26. The component assembly according to claim 25, wherein the second die is encapsulated in a glob top.

27. The component assembly according to claim 26, wherein the first die is configured to process analog signals, and wherein the second is configured to process digital signals.

28. The component assembly according to claim 25, further comprising a passive electronic component mounted on the second portion of the flexible substrate on a side of the second portion opposite the housing.

29. The component assembly according to claim 19, further comprising a first die mounted within the housing and a second die mounted on the exterior bottom surface of the housing.

30. A component assembly, comprising:
   a packaged microphone device including a housing and an acoustic transducer disposed therein, wherein the packaged microphone device has an exterior top surface and an exterior bottom surface opposite the exterior top surface, and wherein the exterior bottom surface of the packaged microphone device includes first electrical terminals disposed thereon, and wherein the housing includes a sound port therethrough; and
   an electronic component mounted on the bottom surface of the packaged microphone device in electrical communication with the first electrical terminals; and
   one or more second electrical terminals on the top surface or bottom surface of the packaged microphone device, the second electrical terminals configured to electrically couple to a system board, wherein the system board is different from the electronic component, and the second electrical terminals are different from the first electrical terminals.

31. The component assembly according to claim 30, further comprising a phone board including an aperture therethrough, wherein the exterior bottom surface of the packaged microphone device is mounted to the phone board such that at least a portion of the electronic component is disposed within the aperture.

32. The component assembly according to claim 30, wherein the housing includes a rigid substrate including a first surface and a second surface opposite the first, wherein the second surface of the rigid substrate defines the exterior bottom surface of the packaged microphone device.

33. The component assembly according to claim 32, further comprising a first die mounted within the housing on the first surface of the rigid substrate.

34. The component assembly according to claim 33, wherein the electronic component comprises a second die.

35. The component assembly according to claim 34, wherein the first die is configured to process analog signals, and wherein the second is configured to process digital signals.

36. The component assembly according to claim 30, wherein the electronic component comprises a passive component electrically connected to the acoustic transducer.

37. The component assembly according to claim 36, wherein the electronic component comprises a trimmable resistor, wherein a resistance of the trimmable resistor determines a sensitivity of the acoustic transducer.

38. A component assembly comprising:
an acoustic transducer component with a housing and an acoustic transducer disposed therein, the housing including an exterior top surface and an exterior bottom surface opposite the exterior top surface, and wherein the housing includes a plurality of electrical terminals disposed on the exterior bottom surface of the housing; and
a conversion substrate including a first portion attached to the exterior top surface of the housing, wherein the first portion of the conversion substrate includes a first plurality of electrical pads disposed on a side of the conversion substrate opposite the housing, the conversion substrate including a second plurality of electrical pads disposed on a side of the conversion substrate facing the housing, wherein at least one of the second plurality of electrical pads is electrically connected to at least one of the plurality of electrical terminals of the housing.

39. The component assembly of claim 38, wherein the conversion substrate further includes a second portion and is flexible at least between the first and second portions, wherein the conversion substrate is folded around the acoustic transducer component such that the first portion attaches to the exterior top surface of the housing and the second portion attaches to the exterior bottom surface of the housing, and wherein the conversion substrate includes a trace electrically connected to at least one of the electrical terminals and to at least one of the electrical pads.

40. The component assembly of claim 38, further comprising a wire including a first end electrically connected to at least one of the electrical terminals and a second end electrically connected to at least one of the electrical pads.

41. The component assembly of claim 30, wherein the packaged microphone device further comprises a flexible substrate having a top portion, a bottom portion and a flexible middle portion, the flexible middle portion disposed between the top and bottom portions, wherein the flexible middle portion is folded around the housing such that the top portion at least partially overlays and attaches to a top side of the housing to define the exterior top surface and the bottom portion at least partially overlays and attaches to a bottom side of the housing to define the exterior bottom surface.

* * * * *